(12) United States Patent
Kim et al.

(10) Patent No.: US 11,205,631 B2
(45) Date of Patent: Dec. 21, 2021

(54) SEMICONDUCTOR PACKAGE INCLUDING MULTIPLE SEMICONDUCTOR CHIPS

(71) Applicant: SAMSUNG ELECTRONICS CO., LTD., Suwon-si (KR)

(72) Inventors: Yonghoon Kim, Suwon-si (KR); Jaehyun Lim, Suwon-si (KR); Yuntae Lee, Suwon-si (KR); Sayoon Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/822,300

(22) Filed: Mar. 18, 2020

(65) Prior Publication Data

US 2020/0335469 A1    Oct. 22, 2020

(30) Foreign Application Priority Data

Apr. 18, 2019  (KR) .................. 10-2019-0045742
Oct. 31, 2019  (KR) .................. 10-2019-0137226

(51) Int. Cl.
*H01L 23/00* (2006.01)
*H01L 23/31* (2006.01)
(Continued)

(52) U.S. Cl.
CPC .......... *H01L 24/24* (2013.01); *H01L 23/3121* (2013.01); *H01L 23/481* (2013.01);
(Continued)

(58) Field of Classification Search
CPC ... H01L 24/24; H01L 23/3121; H01L 23/481; H01L 24/05; H01L 24/13; H01L 25/0657;
(Continued)

(56) References Cited

U.S. PATENT DOCUMENTS 7,557,440 B2    7/2009  Yamamoto et al.
9,831,148 B2   11/2017  Yu et al.
(Continued)

FOREIGN PATENT DOCUMENTS

EP    2916351 A2    9/2015

OTHER PUBLICATIONS

Communication dated Oct. 7, 2020, from the European Patent Office in counterpart European Application No. 20167443.9.

*Primary Examiner* — Mamadou L Diallo
(74) *Attorney, Agent, or Firm* — Sughrue Mion, PLLC

(57) ABSTRACT

Provided is a semiconductor package including a package structure including a base connection member including a redistribution layer, a first semiconductor chip including a plurality of first connection pads connected to the redistribution layer, an encapsulant disposed on the base connection member and covering at least a portion of the first semiconductor chip, and a backside connection member disposed on the encapsulant and including a backside wiring layer electrically connected to the redistribution layer, and a second semiconductor chip disposed on the base connection member or the backside connection member, the second semiconductor chip including a plurality of second connection pads connected to the redistribution layer or the backside wiring layer, the second semiconductor chip including a logic circuit, the first semiconductor chip including a logic input and output terminals that are connected to the logic circuit through at least one of the redistribution layer and the backside wiring layer.

18 Claims, 12 Drawing Sheets

(51) Int. Cl.
*H01L 23/48* (2006.01)
*H01L 25/065* (2006.01)

(52) U.S. Cl.
CPC .............. *H01L 24/05* (2013.01); *H01L 24/13* (2013.01); *H01L 25/0657* (2013.01); *H01L 2924/1431* (2013.01)

(58) Field of Classification Search
CPC ............. H01L 2924/1431; H01L 25/16; H01L 2225/0651; H01L 2225/06562; H01L 2224/16237; H01L 2224/48227; H01L 2224/32145; H01L 2224/32225; H01L 2224/73204; H01L 2224/0401; H01L 24/19; H01L 23/50; H01L 25/105; H01L 23/49816; H01L 23/5389; H01L 25/18; H01L 23/3128; H01L 24/02; H01L 2224/02331; H01L 2224/02333; H01L 2224/02381; H01L 2224/02379; H01L 2224/13008
See application file for complete search history.

(56) References Cited

U.S. PATENT DOCUMENTS

| | | | |
|---|---|---|---|
| 2014/0070422 A1* | 3/2014 | Hsiao | H01L 21/6835 257/774 |
| 2016/0338202 A1* | 11/2016 | Park | H01L 24/00 |
| 2016/0365324 A1* | 12/2016 | Kim | H01L 24/32 |
| 2019/0198486 A1* | 6/2019 | Kim | H01L 24/96 |
| 2019/0229055 A1* | 7/2019 | So | H01L 27/14618 |
| 2020/0118985 A1* | 4/2020 | Chae | H01L 23/3128 |
| 2020/0312797 A1* | 10/2020 | Kang | H01L 24/19 |
| 2020/0321293 A1* | 10/2020 | Kim | H01Q 1/2283 |

\* cited by examiner

SEMICONDUCTOR PACKAGE INCLUDING MULTIPLE SEMICONDUCTOR CHIPS

CROSS-REFERENCE TO THE RELATED APPLICATIONS

This application claims priority to Korean Patent Application No. 10-2019-0137226 filed on Oct. 31, 2019 and Korean Patent Application No. 10-2019-0045742 filed on Apr. 18, 2019 in the Korean Intellectual Property Office, the disclosures of which are incorporated herein by reference in their entireties.

BACKGROUND

1. Field

Example embodiments of the present disclosure relate to a semiconductor package.

2. Description of Related Art

Recently, as smart electronic devices have become advanced, specifications of components used in the electronic devices have also become advanced. For example, a specification of an application processor (AP), a core chip of a smart electronic device, has rapidly advanced. Accordingly, main processor units having a variety of functions have been integrated in a single chip.

SUMMARY

Example embodiments of the present disclosure provide a semiconductor package having improved package performance and having an appropriate package size.

An example embodiment is to provide a semiconductor chip, an application processor chip, for example, which may be divided into a plurality of semiconductor chips and the plurality of semiconductor chips may be stacked in a vertical direction. Further, by disposing a through-via penetrating a semiconductor chip separately disposed on a lower side and/or an electronic component embedded in the semiconductor chip disposed on the lower side and connected to the through-via in the semiconductor chip disposed on the lower side, power transfer properties, and the like, may improve.

According to an aspect of an example embodiment there is provided a semiconductor package including a package structure including a base connection member including a redistribution layer, a first semiconductor chip including a plurality of first connection pads connected to the redistribution layer, an encapsulant disposed on the base connection member and covering at least a portion of the first semiconductor chip, and a backside connection member disposed on the encapsulant and including a backside wiring layer electrically connected to the redistribution layer, and a second semiconductor chip disposed on the base connection member or the backside connection member, the second semiconductor chip including a plurality of second connection pads connected to the redistribution layer or the backside wiring layer, wherein the second semiconductor chip includes a logic circuit, the first semiconductor chip includes a logic input terminal and a logic output terminal that are respectively connected to the logic circuit through at least one of the redistribution layer and the backside wiring layer.

According to another aspect of an example embodiment there is provided a semiconductor package including a first package structure including a first connection member including a first redistribution layer, a first semiconductor chip including a plurality of first connection pads connected to the first redistribution layer, a first encapsulant disposed on the first connection member and covering at least a portion of the first semiconductor chip, a backside connection member disposed on the first encapsulant and including a backside wiring layer electrically connected to the first redistribution layer, and a second package structure including a second connection member disposed on the first connection member or the backside connection member and including a second redistribution layer connected to the first redistribution layer or the backside wiring layer, a second semiconductor chip including a plurality of second connection pads connected to the second redistribution layer, and a second encapsulant disposed on the second connection member and covering at least a portion of the second semiconductor chip, wherein the second semiconductor chip includes a logic circuit, the first semiconductor chip includes a logic input terminal and a logic output terminal that are connected to the logic circuit through at least one of the first redistribution layer, the backside wiring layer, and the second redistribution layer.

According to another aspect of an example embodiment there is provided a semiconductor package including a first package structure including a first connection member including a first redistribution layer, a first semiconductor chip including a plurality of first connection pads connected to the first redistribution layer, a first encapsulant disposed on the first connection member and covering at least a portion of the first semiconductor chip, a backside connection member disposed on the first encapsulant and including a backside wiring layer electrically connected to the first redistribution layer, and an interconnect member disposed between the first connection member and the backside connection member and electrically connecting the first redistribution layer to the backside wiring layer, a second semiconductor chip disposed on the first connection member or the backside connection member, and including a plurality of second connection pads connected to the first redistribution layer or the backside wiring layer, and a third package structure including a third connection member disposed on the first package structure and the second semiconductor chip, a third semiconductor chip disposed on the third connection member, and a molding material disposed on the third connection member and covering at least a portion of the third semiconductor chip, wherein the third semiconductor chip includes a memory, wherein the second semiconductor chip includes a logic circuit and a memory input terminal and a memory output terminal for the memory, wherein the first semiconductor chip includes a logic input terminal and a logic output terminal for the logic circuit, wherein the logic input terminal and the logic output terminal are connected to the logic circuit through at least one of the first redistribution layer and the backside wiring layer, and wherein the memory input terminal and the memory output terminal are connected to the memory through at least one of the first redistribution layer and the backside wiring layer

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described as follows with reference to the accompanying drawings.

Figure 1:
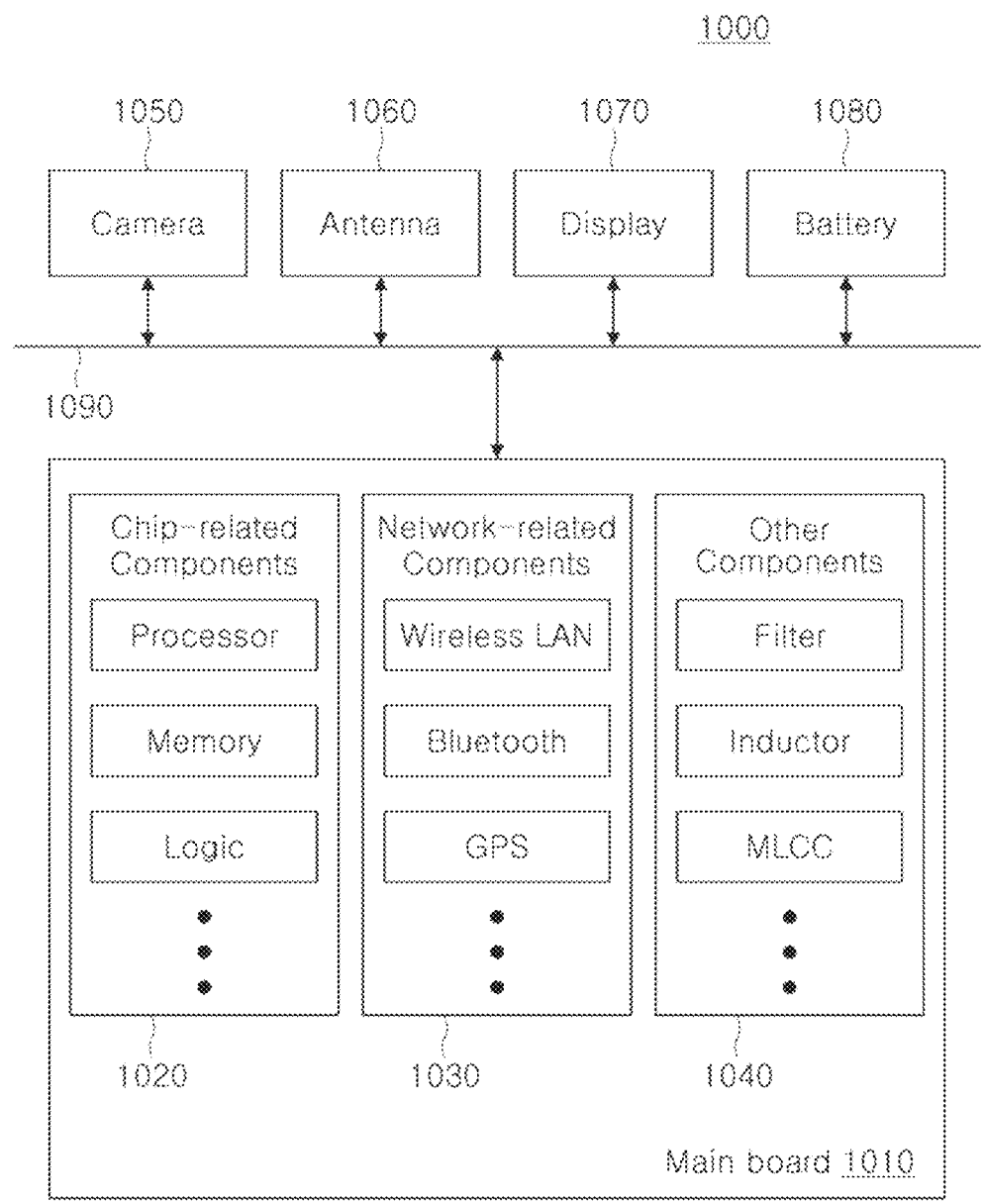
FIG. 1 is a block diagram illustrating an example of an electronic device system.

FIG. 1 is a block diagram illustrating a block diagram illustrating an example of an electronic device system.

Referring to the diagram, an electronic device 1000 may include a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, but may be any other electronic device processing data.

Figure 2:
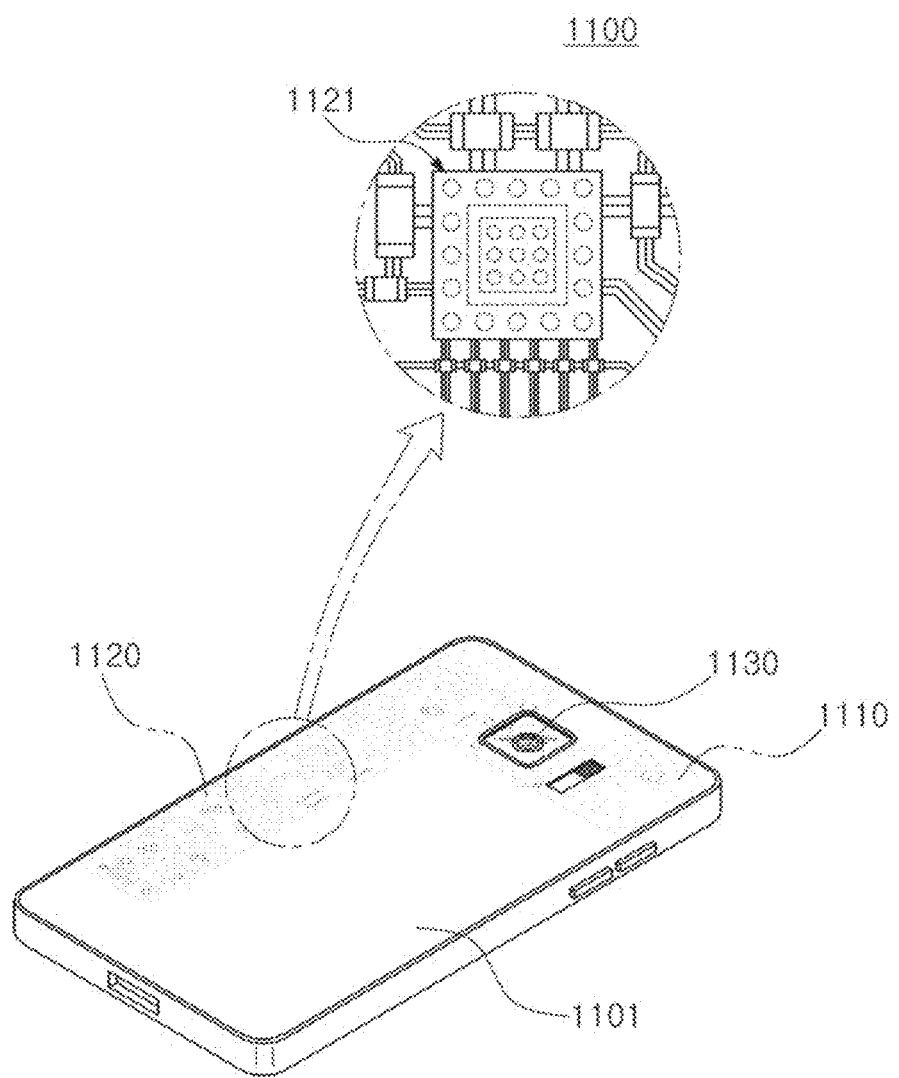
FIG. 2 is a perspective diagram illustrating an example of an electronic device.

FIG. 2 is a perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

A semiconductor packaging process is necessary because there is a difference in width between a semiconductor chip and a mainboard of an electronic device in terms of electrical connection. For example, in a semiconductor chip, a size of a connection pad and a gap between connection pads may be smaller, whereas in a mainboard used in an electronic device, a size of a component mounting pad and a gap between component mounting pads may be greater than a scale of a semiconductor chip. Thus, it may be difficult to directly mount a semiconductor chip on such as mainboard, and a packaging technique which may alleviate a difference in width between circuits may be required.

A semiconductor package manufactured by such a packaging technique may be classified as a fan-in semiconductor package and a fan-out semiconductor package depending on a structure and usage.

In the description below, a fan-in semiconductor package and a fan-out semiconductor package will be described in greater detail with reference to the drawings.

Figure 3B:
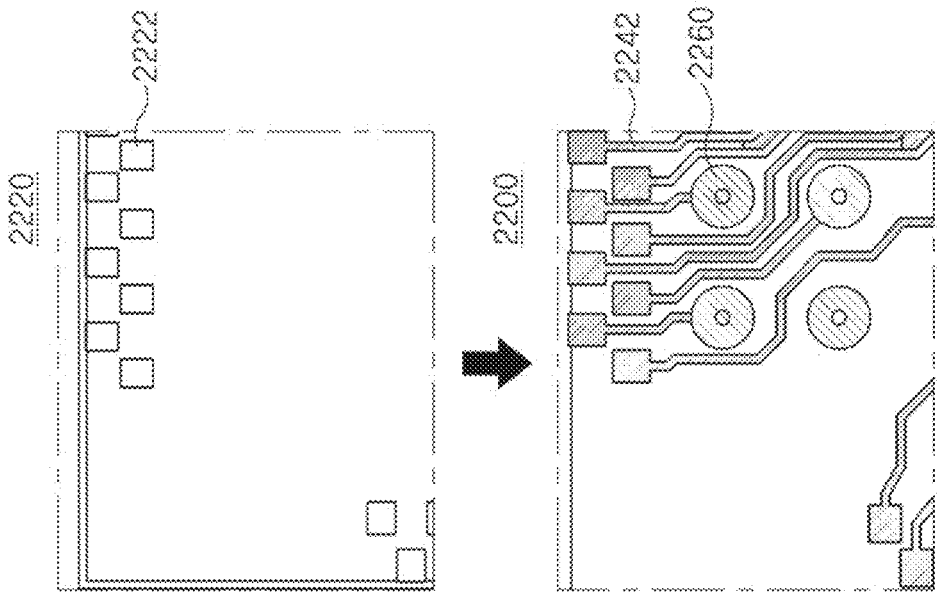
FIGS. 3A and 3B are cross-sectional diagrams illustrating states before and after packaging a fan-in semiconductor package according to an example embodiment.
Figure 3A:
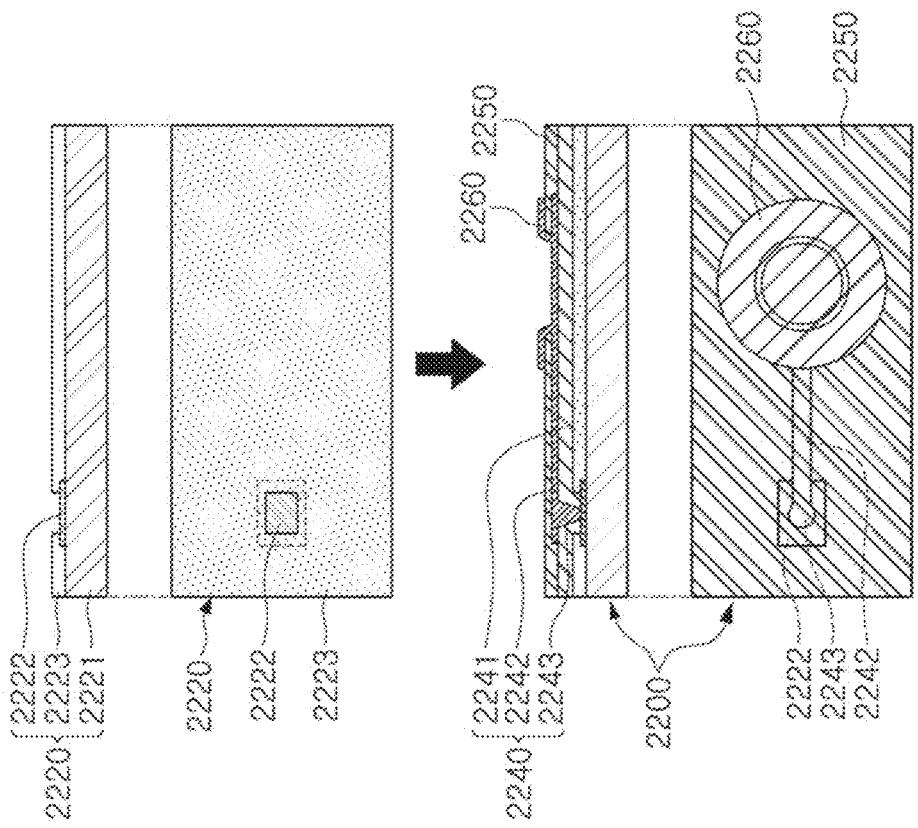

FIGS. 3A and 3B are cross-sectional diagrams illustrating states before and after packaging a fan-in semiconductor package according to an example embodiment.

Figure 4:
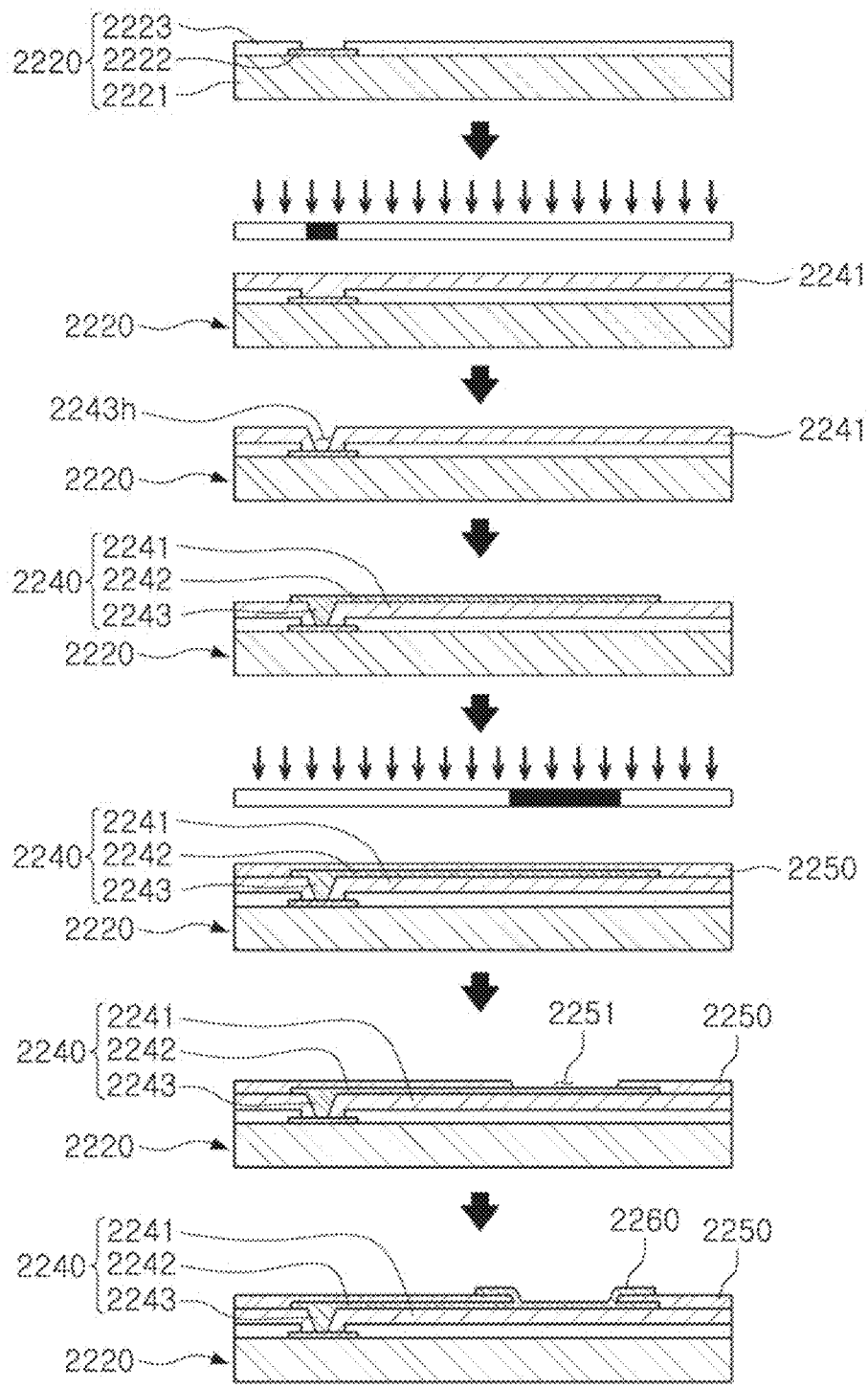
FIG. 4 is a cross-sectional diagram illustrating a packaging process of a fan-in semiconductor package according to an example embodiment.

FIG. 4 is a cross-sectional diagram illustrating a packaging process of a fan-in semiconductor package according to an example embodiment.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening and exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer and to have a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be enough to directly mount the fan-in semiconductor package on the mainboard of the electronic device.

Figure 5:
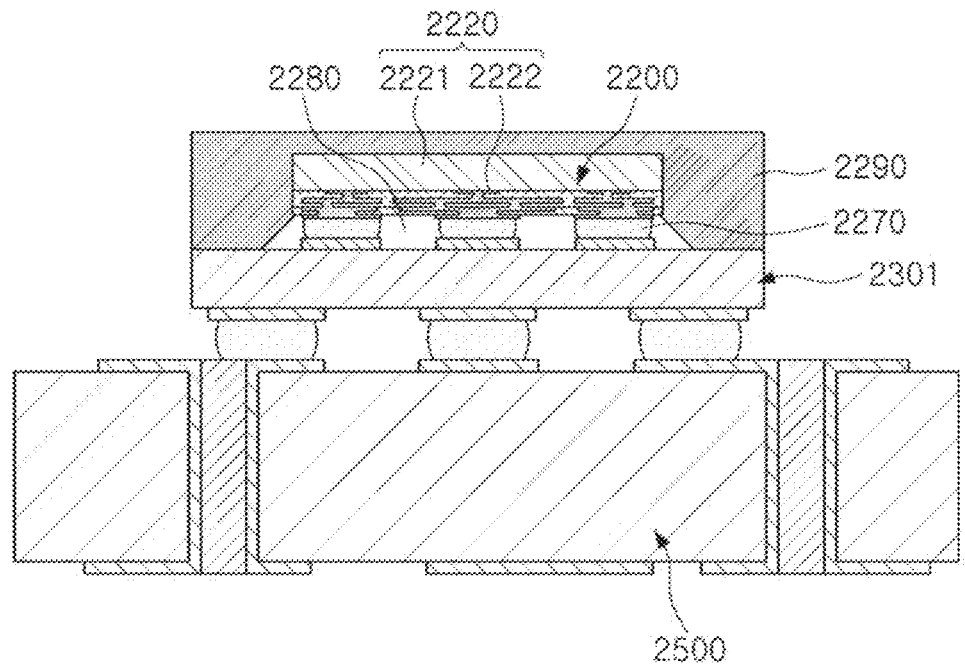
FIG. 5 is a cross-sectional diagram illustrating an example in which a fan-in semiconductor package is mounted on a printed circuit board and mounted on a mainboard of an electronic device according to an example embodiment.

FIG. 5 is a cross-sectional diagram illustrating an example in which a fan-in semiconductor package is mounted on a printed circuit board and mounted on a mainboard of an electronic device according to an example embodiment.

Figure 6:
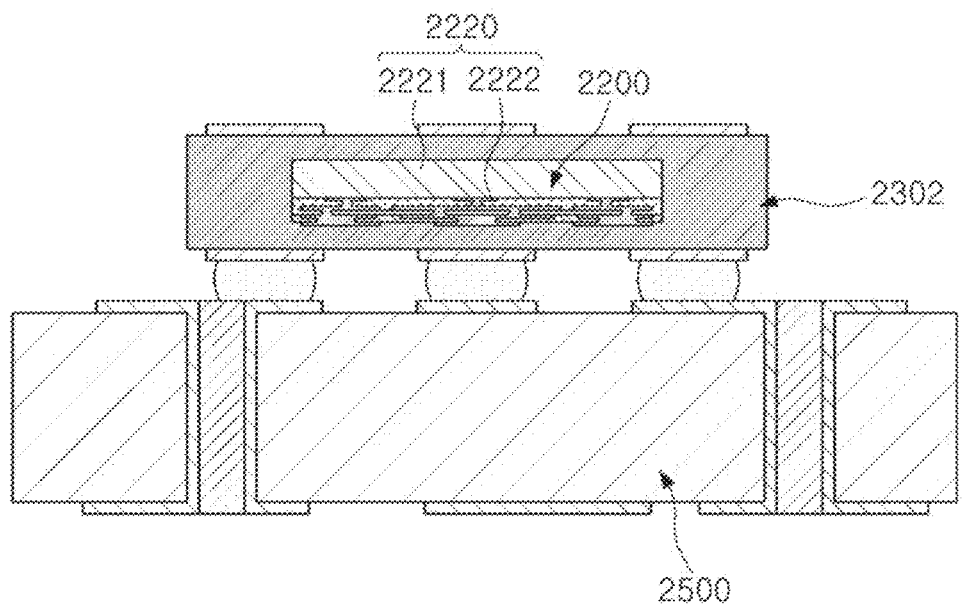
FIG. 6 is a cross-sectional diagram illustrating an example in which a fan-in semiconductor package is mounted on a printed circuit board and mounted on a mainboard of an electronic device according to an example embodiment.

FIG. 6 is a cross-sectional diagram illustrating an example in which a fan-in semiconductor package is mounted on a printed circuit board and mounted on a mainboard of an electronic device according to an example embodiment.

Referring to FIGS. 5 and 6, in a fan-in semiconductor package 2200, connection pads 2222, that is, I/O terminals, of a semiconductor chip 2220 may be redistributed through a ball grid array (BGA) substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. A fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Figure 7:
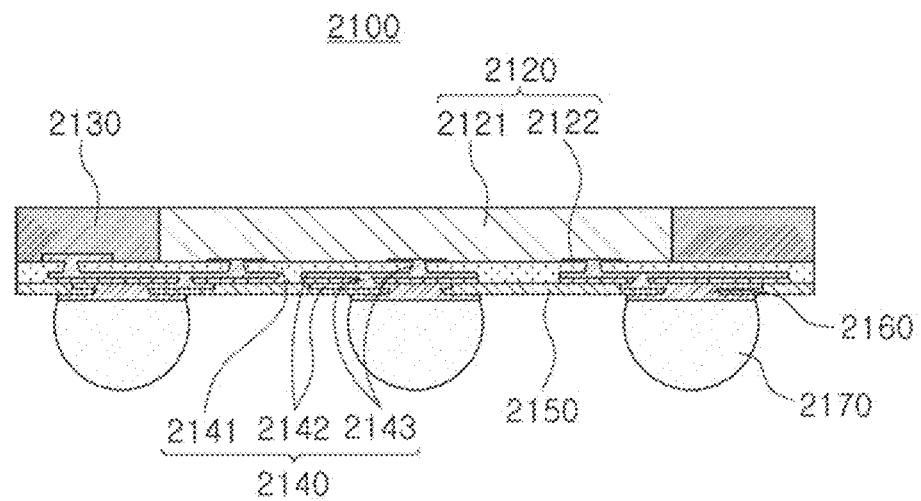
FIG. 7 is a cross-sectional diagram illustrating a fan-out semiconductor package according to an example embodiment.

FIG. 7 is a cross-sectional diagram illustrating a fan-out semiconductor package according to an example embodiment.

Referring to FIG. 7, in a fan-out semiconductor package 2100, for example, an outer side surfaces of a semiconductor chip 2120 may be at least partially covered by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer, and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even when a size of the semiconductor chip is decreased, a standardized ball layout may be used in the fan-out semiconductor package as is, such that the fan-out semiconductor package may be mounted on the mainboard of the electronic device without using a separate BGA substrate, as described below.

Figure 8:
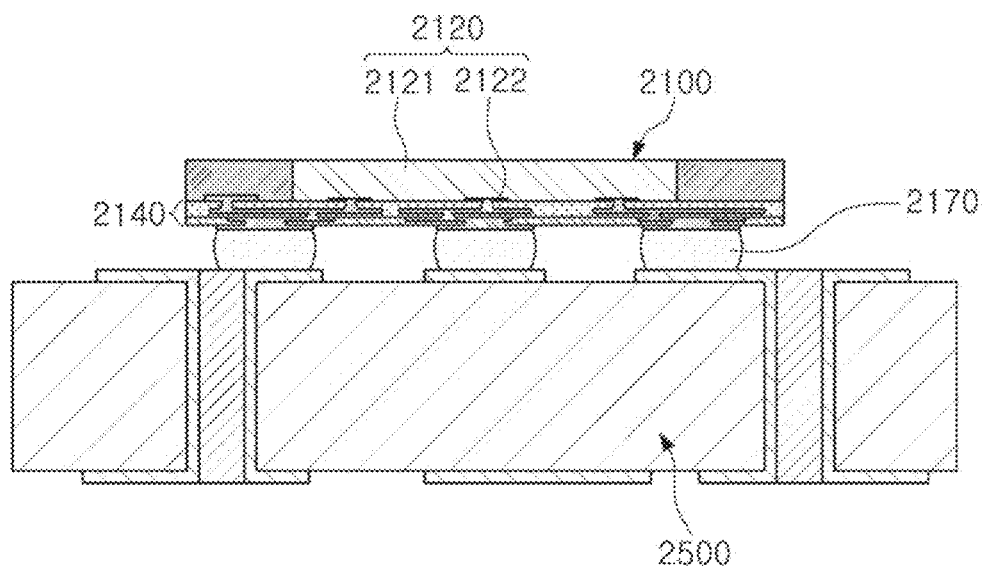
FIG. 8 is a cross-sectional diagram illustrating an example in which a fan-out semiconductor package is mounted on a mainboard of an electronic device according to an example embodiment.

FIG. 8 is a cross-sectional diagram illustrating an example in which a fan-out semiconductor package is mounted on a mainboard of an electronic device according to an example embodiment.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and configured to redistribute the connection pads 2122 to a fan-out region that is outside of a size of the semiconductor chip 2120, such that the standardized ball layout may be used in the fan-out semiconductor package 2100 as is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may have a reduced size and a reduce thickness. In addition, the fan-out electronic component package has improved thermal properties and electrical properties such that it may be used in a mobile product. Therefore, the fan-out electronic component package may be implemented in a form more compact than that of a general package-on-package (POP) type using a printed circuit board (PCB), and may prevent or reduce a problem caused by a warpage phenomenon.

The fan-out semiconductor package refers to a packaging technique for mounting the semiconductor chip on the mainboard of the electronic device, or the like, as described above, and protecting the semiconductor chip from external impacts. A concept of a packaging technique is different from that of a printed circuit board (PCB) such as a BGA substrate, or the like, which may have a scale, a purpose, and the like, different from those of the packaging technique and may include a fan-in semiconductor package embedded therein.

In the description below, a semiconductor package which may improve a package performance and may have an appropriate package size will be described with reference to the drawings.

Figure 9:
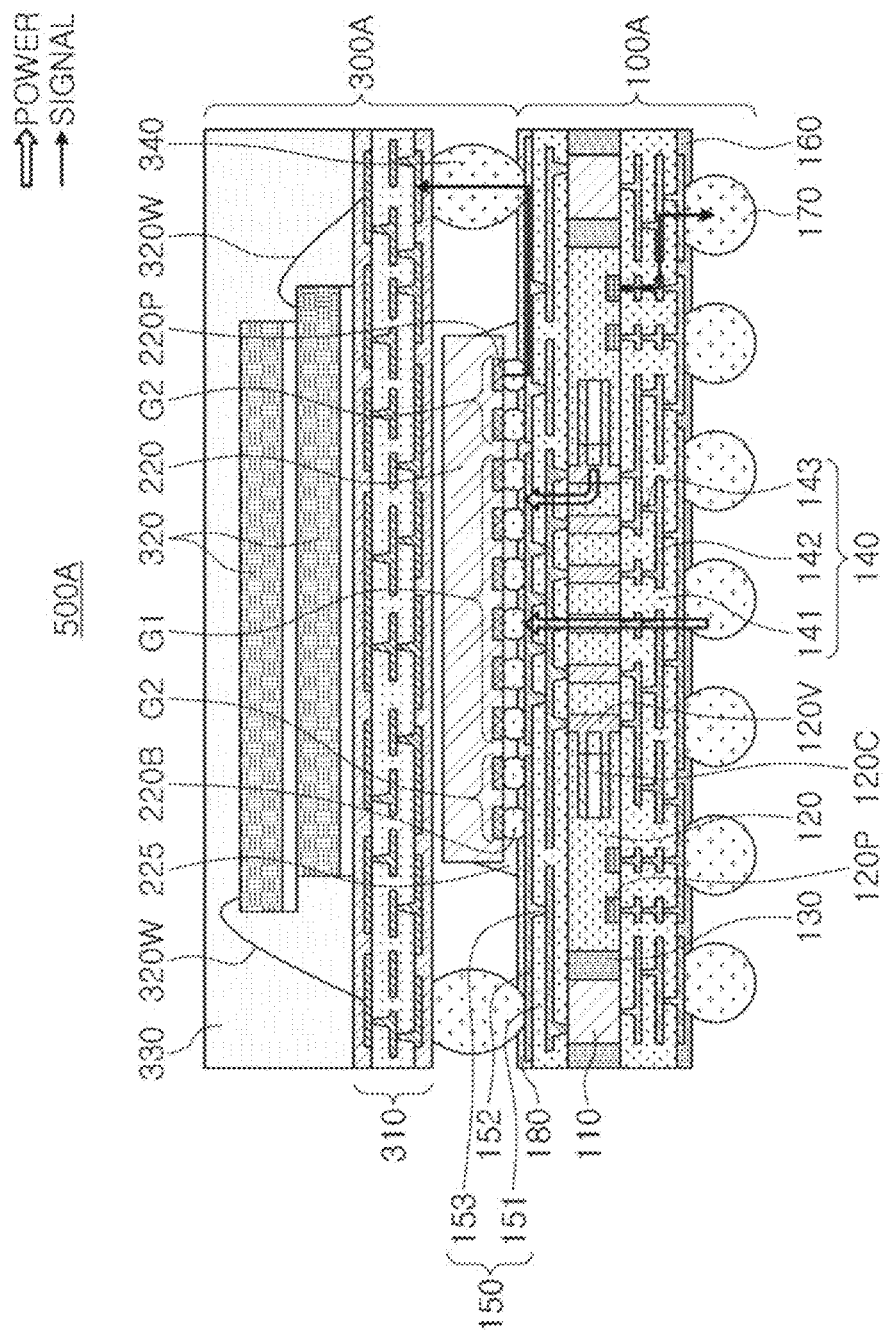
FIG. 9 is a cross-sectional diagram illustrating an example of a semiconductor package according to an example embodiment.

FIG. 9 is a cross-sectional diagram illustrating an example of a semiconductor package according to an example embodiment.

Referring to FIG. 9, a semiconductor package 500A may include a first package structure 100A including a first semiconductor chip 120, and a second semiconductor chip 220 disposed on the first package structure 100A. The second semiconductor chip 220 may be mounted on a surface of the first package structure 100A using a connection bump 220B, and the like. If required, the semiconductor package 500A in the example embodiment may further include a third package structure 300A disposed on the first package structure 100A with the second semiconductor chip 220 interposed therebetween. The third package structure 300A may be mounted on the first package structure 100A in a form of a package-on-package (POP) using a third electrical connector metal 340, and the like. An electrical connection path of power and a signal is as in the diagram, for example.

The first package structure 100A may include a first semiconductor chip 120 having a plurality of first connection pads 120P, a first encapsulant 130 covering at least a portion of the first semiconductor chip 120, a first connection member 140 disposed on a lower side of each of the first encapsulant 130 and the first semiconductor chip 120 and including one or more first redistribution layers 142, and a backside connection member 150 disposed on an upper side of the first encapsulant 130 and including one or more backside wiring layer 152. Also, the first package structure 100A may further include a first interconnect member 110 disposed between the first connection member 140 and the backside connection member 150 and electrically connecting the first redistribution layer 142 to the backside wiring layer 152. According to an example embodiment, a first passivation layer 160 and a first electrical connector metal 170 may be disposed on a lower side of the first connection member 140. A cover layer 180 may be disposed on an upper side of the backside connection member 150.

The first semiconductor chip 120 may include a through-via 120V penetrating the first semiconductor chip 120. The through-via 120V may be electrically connected to the first redistribution layer 142 of the first connection member 140 and to the backside wiring layer 152 of the backside connection member 150. The second semiconductor chip 220 may overlap the first semiconductor chip 120 on a plane in a vertical direction in which the first semiconductor chip 120 and the second semiconductor chip 220 are stacked. At least a portion of a plurality of second connection pads 220P of the second semiconductor chip 220 may pass through the backside wiring layer 152, the through-via 120V, and the first redistribution layer 142 almost vertically and may be electrically connected to the first electrical connector metal 170. Accordingly, a path for the transfer of power, and the like, may be significantly reduced.

The first semiconductor chip 120 may include an electronic component 120C disposed in the first semiconductor chip 120 and electrically connected to the through-via 120V. The electronic component 120C may be implemented as a metal-insulator-metal (MIM) type capacitor, for example. Accordingly, power properties may improve effectively. According to an example embodiment, the electronic component 120C may be implemented as a certain memory unit, an SRAM, for example. Accordingly, an SRAM may not be provided or a size of an SRAM may be reduced in the second semiconductor chip 220 such that a size of the second semiconductor chip 220 may be reduced. According to an example embodiment, the electronic component 120C may include both of the above-described capacitor and the memory unit.

The first semiconductor chip 120 and the second semiconductor chip 220 may operate together as a semiconductor chip to implement a specific function. For example, the first semiconductor chip 120 and the second semiconductor chip 220 may implement a function of at least one application process. Thus, the first semiconductor chip 120 and the second semiconductor chip 220 may be configured by dividing a certain semiconductor chip, such as an application processor chip, into a plurality of semiconductor chips such as first semiconductor chip 120 and the second semiconductor chip 220. By the division, a size of the second semiconductor chip 220 including a core unit may be reduced, and performance may be optimized. Also, by dividing a semiconductor chip into a portion requiring a more difficult design and a portion requiring a less difficult design, a defect in one of the processes of manufacturing the first semiconductor chip 120 and the second semiconductor chip 220 may not affect the other such that yield may improve and costs may be reduced.

For example, the first semiconductor chip 120 may include an input and output unit of an application processor. The plurality of second connection pads 220P may include a plurality of pads for input and output operations of an application processor. In the second semiconductor chip 220, a central semiconductor chip may include a core unit such as a central processing unit (CPU), a graphics processing unit (GPU), a neural processing unit (NPU), a digital signal processor unit (DSPU), an image signal processing unit (ISPU), and the like. The plurality of second connection pads 220P may include a plurality of first groups G1 for such core units. The second semiconductor chip 220 may further include an input and output (I/O) unit for electrical connection with a memory. The plurality of second connection pads 220P may include a plurality of second groups G2 for input and output operations in relation to a memory. The memory may be implemented by a DRAM, and may be configured as a third semiconductor chip 320 of a third package structure 300A.

In the description below, elements of the semiconductor package 500A will be described in greater detail with reference to the drawings.

The first package structure 100A may include the first connection member 140 having the first redistribution layer 142, the first semiconductor chip 120 having the plurality of first connection pads 120P connected to the first redistribution layer 142, the first encapsulant 130 disposed on the first connection member 140 and covering at least a portion of the first semiconductor chip 120, the backside connection member 150 disposed on the first encapsulant 130 and having a backside wiring layer 152 electrically connected to the first redistribution layer 142, and the interconnect member 110 disposed between the first connection member 140 and the backside connection member 150 and electrically connecting the first redistribution layer 142 to the backside wiring layer 152. According to an example embodiment, the first passivation layer 160 and the first electrical connector metal 170 may be disposed on a lower side of the first connection member 140. Also, the cover layer 180 may be disposed on an upper side of the backside connection member 150.

The interconnect member 110 may be disposed between the first connection member 140 and the backside connection member 150, may penetrate the first encapsulant 130, and may electrically connect the first redistribution layer 142 to the backside wiring layer 152. The interconnect member 110 may include a metal material such as copper (Cu), aluminum (Al), silver (Ag), tin (Sn), gold (Au), nickel (Ni), lead (Pb), titanium (Ti) or alloys thereof. The interconnect member 110 may have a post shape penetrating the first encapsulant 130. For example, the interconnect member 110 may be formed by encapsulating a post including a conductive material with the first semiconductor chip 120 using the first encapsulant 130. An upper surface of the interconnect member 110 may be coplanar with an upper surface of the first encapsulant 130 and an upper surface of the first semiconductor chip 120. However, embodiments are not limited thereto. For example, an upper surface of the interconnect member 110 may be covered by the first encapsulant 130, and in this case, the interconnect member 110 may be connected to the backside wiring layer 152 by a backside via 153 penetrating the first encapsulant 130.

The first semiconductor chip 120 may be implemented as an integrated circuit (IC) in which several hundreds to several millions of elements are integrated in a single chip. The integrated circuit included in the first semiconductor chip 120 may be implemented as, for example, an application processor chip, a partial unit of which is separated and omitted as described above. The first semiconductor chip 120 may be configured as an integrated circuit in a bare state which does not include a bump or a wiring layer. However, embodiments are not limited thereto, and the first semiconductor chip 120 may be configured as a packaged type integrated circuit. The integrated circuit may be formed based on an active wafer. In this case, as a base material of a body of the first semiconductor chip 120, silicon (Si), germanium (Ge), gallium arsenide (GaAs), or the like, may be used. Various circuits may be included in the body. The first connection pad 120P is configured to electrically connect the first semiconductor chip 120 to the other element, and as a material of the first connection pad 120P, a metal material such as copper (Cu), aluminum (Al), or the like, may be used. A passivation film for opening the first semiconductor chip 120 may be disposed on the body. The passivation film may be implemented by an oxide film or a nitride film, or may be implemented by a double layer including an oxide film and a nitride film. An insulating layer, and the like, may be disposed on other positions.

The first encapsulant 130 may cover at least a portion of the first semiconductor chip 120 and the first interconnect member 110. The first encapsulant 130 may include an insulating material, and as an insulating material, a non-photosensitive insulating material, a non-photosensitive insulating material including an inorganic filler and an insulating resin, such as a thermosetting resin such as an epoxy resin, a thermoplastic resin such as polyimide, a resin formed by the above-described resin including a reinforcement such as an inorganic filler, that is, an Ajinomoto Built-up Film (ABF), an epoxy molded compound (EMC), or the like, may be used. According to an example embodiment, a material in which an insulating resin such as a thermosetting resin or a thermoplastic resin is impregnated in a core material such as an inorganic filler and/or a glass fiber may be used. Accordingly, the issues of voids and undulation may be prevented or reduced, and warpage control may be more easily performed. According to an example embodiment, a photoimageable encapsulant (PIE) may be used.

The first connection member 140 may redistribute the first connection pad 120P and/or the second connection pad 220P. Each of a plurality of the first connection pad 120P and/or the second connection pad 220P having various functions may be redistributed through the first connection member 140, and the plurality of the first connection pad 120P and/or the second connection pad 220P may be physically and/or electronically connected to an external entity through the first electrical connector metal 170 in accordance with respective functions of the connection pads. The first connection member 140 may include a first insulating layer 141, the first redistribution layer 142 disposed on a lower surface of the first insulating layer 141, and a first connection via 143 penetrating the first insulating layer 141 and connected to the first redistribution layer 142. The number of each of the first insulating layer 141, the first redistribution layer 142, and the first connection via 143 may be greater or less than the examples illustrated in the diagram. In other words, the number of the layers may be varied in example embodiments.

As a material of the first insulating layer 141, an insulating material may be used, and as an insulating material, a photosensitive insulating material (PID) may be used. In this case, a fine pitch may be introduced through a photo-via such that it may be possible to implement a fine circuit and a high-density design, and the plurality of first connection pad 120P and/or the second connection pad 220P may be redistributed in a more effective manner. A boundary between the first insulating layers 141 may be distinct or indistinct.

The first redistribution layer 142 may redistribute the plurality of first connection pad 120P and/or the second connection pad 220P and may electrically connect the plurality of first connection pad 120P and/or the second connection pad 220P to the first electrical connector metal 170. As a material of the first redistribution layer 142, a metal material such as copper (Cu), aluminum (Al), silver (Ag), tin (Sn), gold (Au), nickel (Ni), lead (Pb), titanium (Ti), or alloys thereof may be used. According to example embodiments, the first redistribution layer 142 may perform various functions. For example, the first redistribution layer 142 may include a ground (GND) pattern, a power (PWR) pattern, a signal (S) pattern, and the like. The ground (GND) pattern and the power (PWR) pattern may be the same pattern. The first redistribution layer 142 may also include various types of via pads, electrical connector metal pads, and the like. The first redistribution layer 142 may be formed by a plating process, and may include a seed layer and a conductor layer.

The first connection via 143 may electrically connect the first redistribution layers 142 disposed on different levels to each other. The first connection via 143 may also electrically connect the first connection pad 120P of the first semiconductor chip 120 and the first interconnect member 110 to the first redistribution layers 142. The first connection via 143 may be physically in contact with the first connection pad 120P when the first semiconductor chip 120 is a bare die. As a material of the first connection via 143, a metal material such as copper (Cu), aluminum (Al), silver (Ag), tin (Sn), gold (Au), nickel (Ni), lead (Pb), titanium (Ti), or alloys thereof may be used. The first connection via 143 may include a via for a signal, a via for power, a via for ground, and the like, and a via for power and a via for ground may be the same via. The first connection via 143 may also be a filled type via filled with a metal material, or may be a conformal type via in which a metal material is formed along a wall of a via hole. The first connection via 143 may have a tapered shape, tapered in a direction opposite to a tapered direction of first wiring vias 113a and 113b. The first connection via 143 may also be formed by a plating process, and may include a seed layer and a conductor layer.

The backside connection member 150 may redistribute the second connection pads 220P. Each of the second connection pads 220P having various functions may be redistributed through the backside connection member 150. The backside connection member 150 may include a backside insulating layer 151, a backside wiring layer 152 disposed on an upper surface of the backside insulating layer 151, a backside via 153 penetrating the backside insulating layer 151 and connected to the backside wiring layer 152. The number of each of the backside insulating layer 151, the backside wiring layer 152, and the backside via 153 may vary according to example embodiments.

The backside insulating layer 151 may include a thermosetting resin. For example, the backside insulating layer 151 may be an ABF. However, an example embodiment thereof is not limited thereto, and the backside insulating layer 151 may include a PID similar to the first insulating layer 141. A boundary between a plurality of the backside insulating layers 151 may be distinct or indistinct.

The backside wiring layer 152 may be disposed on the first encapsulant 130 and may provide a backside circuit to the first package structure 100A along with the backside via 153. The backside wiring layer 152 may include a metal material such as copper (Cu), aluminum (Al), silver (Ag), tin (Sn), gold (Au), nickel (Ni), lead (Pb), titanium (Ti), or alloys thereof. The backside wiring layer 152 may perform various functions according to example embodiments. For example, the backside wiring layer 152 may include a ground (GND) pattern, a power (PWR) pattern, a signal (S) pattern, and the like. The signal (S) pattern may include various types of signals such as a data signal other than the ground (GND) pattern, the power (PWR) pattern, and the like. The ground (GND) pattern and the power (PWR) pattern may be the same pattern. The backside wiring layer 152 may be formed by a plating process, and may include a seed layer and a conductor layer.

The backside via 153 may penetrate the first encapsulant 130 and/or the backside insulating layer 151. The backside via 153 may electrically connect the backside wiring layer 152 to a 1-3 wiring layer 112c. The backside via 153 may also electrically connect the backside wiring layers 152 disposed on different levels to each other. The backside via 153 may include a metal material such as copper (Cu), aluminum (Al), silver (Ag), tin (Sn), gold (Au), nickel (Ni), lead (Pb), titanium (Ti), or alloys thereof. The backside via 153 may be a filled type via filled with a metal material, or may be a conformal type via in which a metal material is formed along a wall of a via hole. The backside via 153 may have a tapered shape, tapered in the same direction as a tapered direction of the first wiring vias 113a and 113b. The backside via 153 may include a via for a signal, a via for power, a via for ground, and the like, and a via for power and a via for ground may be the same via. The backside via 153 may be formed by a plating process, and may include a seed layer and a conductor layer.

The first passivation layer 160 may be an additional element which may protect the first connection member 140 from external physical and chemical damages, and other damages. The first passivation layer 160 may include a thermosetting resin. For example, the first passivation layer 160 may be an ABF, but example embodiments are not limited thereto. The first passivation layer 160 may have an opening exposing at least a portion of a lowermost first redistribution layer 142. Several tens to several millions of the openings may be provided on the first passivation layer 160, or the number of the openings may be higher or lower than the aforementioned example. Each of the openings may include a plurality of holes. According to an example embodiment, a surface mount component such as a capacitor may be disposed on a lower surface of the first passivation layer 160 such that the first passivation layer 160 may be electrically connected to the first redistribution layer 142, and the first passivation layer 160 may also be electrically connected to the first semiconductor chip 120.

The first electrical connector metal 170 may also be an additional element, and may physically and/or electronically connect the semiconductor package 500A with an external entity. For example, the semiconductor package 500A according to the example embodiment may be mounted on a mainboard of an electronic device through the first electrical connector metal 170. The first electrical connector metal 170 may be disposed on each of the openings of the first passivation layer 160. The first electrical connector metal 170 may be formed of a low melting point metal, such as tin (Sn) or an alloy including tin (Sn), for example. As an example, the first electrical connector metal 170 may be formed of solder, or the like, but example embodiments are not limited thereto.

The first electrical connector metal 170 may be implemented as a land, a ball, a pin, or the like. The first electrical connector metal 170 may include multiple layers or a single layer. When the first electrical connector metal 170 includes multiple layers, the first electrical connector metal 170 may include a copper pillar and solder, and when the first electrical connector metal 170 includes a single layer, the first electrical connector metal 170 may include tin-silver solder or copper, but example embodiments are not limited thereto. The number of the first electrical connector metal 170, a gap between the first electrical connector metals 170, and a dispositional form of the first electrical connector metal 170 are not limited to any particular example, and may be varied according to the example embodiments. For example, the number of the first electrical connector metal 170 may be several tens to several millions in accordance with the number of the plurality of first connection pad 120P and/or the second connection pad 220P, and may be higher or lower than the above-mentioned example.

At least one of the first electrical connector metals 170 may be disposed in a fan-out region. A fan-out region may refer to a region beyond a region in which the first semiconductor chip 120 and the second semiconductor chip 220 are disposed. A fan-out package may have improved reliability as compared to a fan-in package, may implement a plurality of I/O terminals, and may easily perform 3D interconnection. Also, a fan-out package may have a reduced thickness as compared to a BGA package, a land grid array (LGA) package, and the like, and may be cost-competitive.

The first electrical connector metal 170 may be connected to a lowermost first redistribution layer 142 through an underbump metal if desired, and in this case, connection reliability of the first electrical connector metal 170 may improve. Accordingly, board-level reliability of the first package structure 100A may be improved. The underbump metal may be formed by a well-known metallization method using a metal, but an example embodiment thereof is not limited thereto.

The cover layer 180 may be an additional element for protecting the backside connection member 150 from external physical and chemical damages, and others. The cover layer 180 may include thermosetting resin. For example, the cover layer 180 may be an ABF, but an example embodiment thereof is not limited thereto. The cover layer 180 may have an opening for opening at least a portion of an uppermost backside wiring layer 152. Several tens to several millions of the openings may be provided, or the number of the openings may be higher or lower than the above-mentioned example. Each of the openings may include a plurality of holes.

The second semiconductor chip 220 may be disposed on the first package structure 100A (the first connection member 140 or the backside connection member 150). For example, the second semiconductor chip 220 may be mounted on a surface of the backside connection member 150 of the first package structure 100A using a connection bump 220B, or the like. The second semiconductor chip 220 may be fixed on the first package structure 100A through an underfill resin 225.

The second semiconductor chip 220 may be configured as an integrated circuit IC in which several hundreds to several millions of elements are integrated in a single chip. An integrated circuit included in the second semiconductor chip 220 may be configured as an application processor, a partial unit of which is separated and omitted as described above. The second semiconductor chip 220 may be configured as an integrated circuit in a bare state in which a bump or a wiring layer is not formed. However, an example embodiment thereof is not limited thereto, and the second semiconductor chip 220 may be configured as a packaged type integrated circuit if desired. The integrated circuit may be formed based on an active wafer. In this case, as a base material of the body of the second semiconductor chip 220, silicon (Si), germanium (Ge), gallium arsenide (GaAs), or the like, may be used. The body may include various circuits. The second connection pad 220P may electrically connect the second semiconductor chip 220 to the other element, and as a material of the second connection pad 220P, a metal material such as copper (Cu), aluminum (Al), or the like, may be used. A passivation film for opening the second semiconductor chip 220 may be formed on the body. The passivation film may be an oxide film, a nitride file, or the like, or may be a dual layer including an oxide film and a nitride file. An insulating film, or the like, may also be disposed in other desired position.

By the connection bump 220B, the second semiconductor chip 220 may be mounted on the first package structure 100A, on a surface of the cover layer 180, for example. The connection bump 220B may be connected to each of the uppermost backside wiring layers 152 exposed through the openings of the cover layer 180. The connection bump 220B may be formed of a low melting point metal, tin (Sn) or an alloy including tin (Sn), for example. As an example, the connection bump 220B may be a solder bump formed of a solder paste, but an example embodiment thereof is not limited thereto.

The underfill resin 225 may fasten the second semiconductor chip 220 by filling a region between the second semiconductor chip 220 and a cover layer 190. The underfill resin 225 may cover at least a portion of each of the connection bumps 220B. The underfill resin 225 may cover at least a portion of a side surface of the second semiconductor chip 220. The underfill resin 225 may include epoxy, but a material of the underfill resin 225 is not limited thereto.

The third package structures 300A may be disposed on the first package structure 100A with the second semiconductor chip 220 interposed therebetween. The third package structure 300A may be mounted on the first package structure 100A in a form of POP using the third electrical connector metal 340, and the like. The third package structure 300A may include a printed circuit board 310 (or may be referred to as "third connection member"), a plurality of third semiconductor chips 320 stacked and disposed on an upper side of the printed circuit board 310 and electrically connected to the printed circuit board 310 through a wiring bonding 320W, a molding material 330 disposed on an upper side of the printed circuit board 310 and covering the third semiconductor chip 320, and the third electrical connector metal 340 disposed on a lower side of the printed circuit board 310 and connecting the first and third package structures 100A and 300A to each other. Each of the plurality of third semiconductor chips 320 may be implemented as a memory chip, a DRAM, for example. Thus, the third package structure 300A may be configured as a DRAM package.

Figure 10:
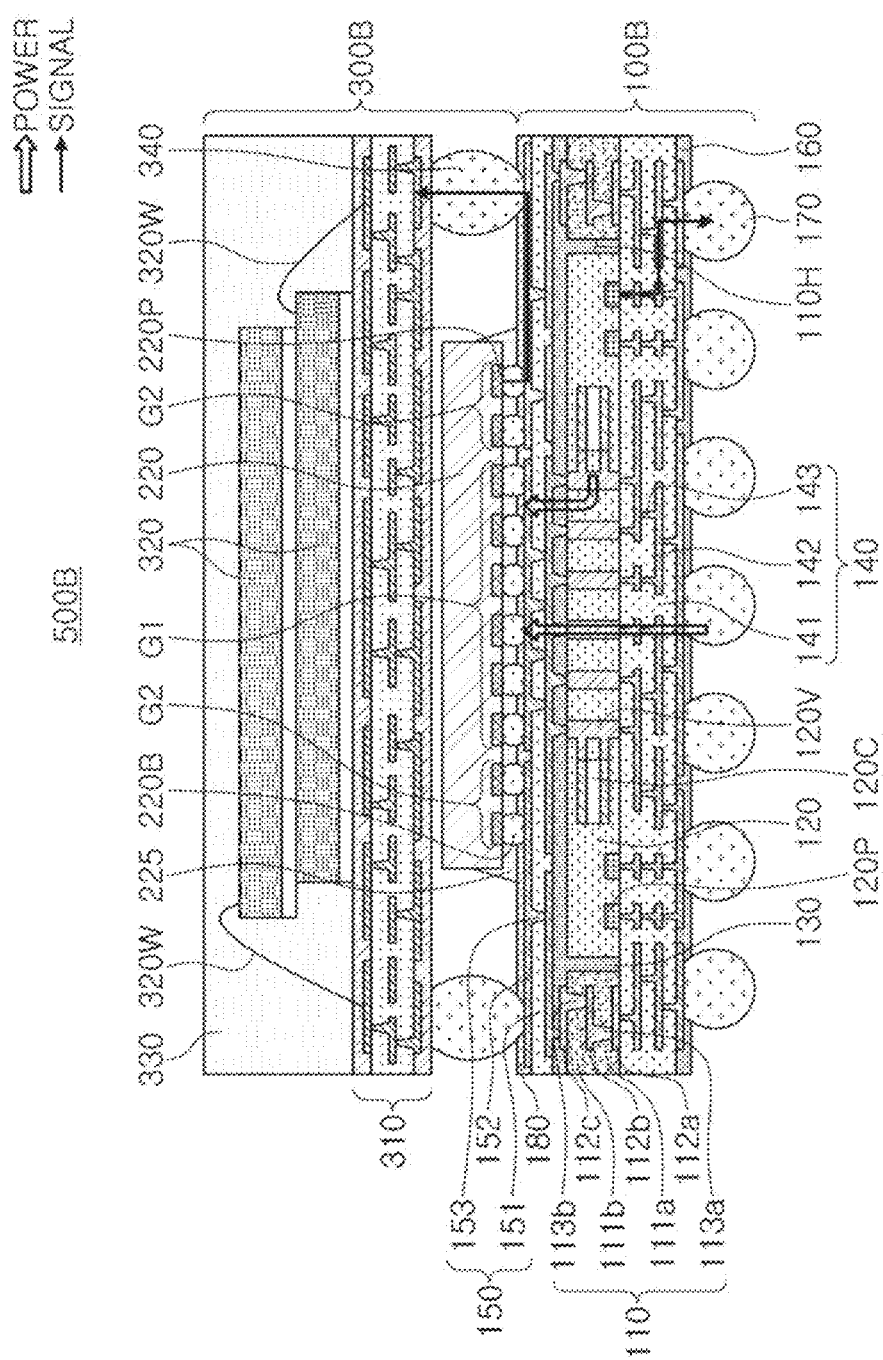
FIG. 10 is a cross-sectional diagram illustrating another example of a semiconductor package according to an example embodiment.

FIG. 10 is a cross-sectional diagram illustrating another example of a semiconductor package according to an example embodiment.

Referring to the diagram, in a semiconductor package 500B, an interconnect member 110 may be configured as a first frame 110 having a first through portion 110H in which a first semiconductor chip 120 is disposed. For example, a first package structure 100B may include the first frame 110 having the first through portion 110H and including one or more first wiring layers 112a, 112b, and 112c, a first semiconductor chip 120 disposed in the first through portion 110H and having a plurality of first connection pads 120P, a first encapsulant 130 covering at least a portion of each of the first frame 110 and the first semiconductor chip 120 and filling at least a portion of the first through portion 110H, a first connection member 140 disposed on a lower side of each of the first frame 110 and the first semiconductor chip 120 and including one or more first redistribution layers 142, and a backside connection member 150 disposed on an upper side of the first encapsulant 130 and including one or more backside wiring layers 152. If desired, a first passivation layer 160 and a first electrical connector metal 170 may be disposed on a lower side of the first connection member 140. Also, a cover layer 180 may be disposed on an upper side of the backside connection member 150.

The first frame 110 may improve stiffness of the first package structure 100A depending on a specific material of insulating layers 111a and 111b, and may secure uniformity of a thickness of the first encapsulant 130. The first frame 110 may have the first through portion 110H penetrating the insulating layers 111a and 111b. The first semiconductor chip 120 may be disposed in the first through portion 110H, and if desired, a passive component may also be disposed in the first through portion 110H. A wall of the first through portion 110H may surround the first semiconductor chip 120, but an example embodiment thereof is not limited thereto. The first frame 110 may include the first wiring layers 112a, 112b, and 112c and first wiring vias 113a and 113b in addition to the insulating layers 111a and 111b, and may work as an electrical connection member providing upper and lower electrical connection paths. If desired, an electrical connection member which may provide a different form of upper and lower electrical connection paths, such as a metal post, may be included in the first frame 110.

In an example embodiment, the first frame 110 may include a 1-1st insulating layer 111a, a 1-1st wiring layer 112a in contact with the first connection member 140 and buried in the 1-1st insulating layer 111a, a 1-2nd wiring layer 112b disposed in a region opposite to the region of the 1-1st insulating layer 111a in which the 1-1st wiring layer 112a is buried, a 1-2nd insulating layer 111b disposed in a region opposite to the region of the 1-1st insulating layer 111a in which the 1-1st wiring layer 112a is buried, and covering at least a portion of the 1-2nd wiring layer 112b, and a 1-3rd wiring layer 112c disposed in a region opposite to the region of the 1-2nd insulating layer 111b in which the 1-2nd wiring layer 112b is buried. The 1-1st and 1-2nd wiring layers 112a and 112b and the 1-2nd and 1-3rd wiring layers 112b and 112c may be connected to each other through the 1-1st and 1-2nd wiring vias 113a and 113b penetrating the 1-1st and 1-2nd insulating layers 111a and 111b, respectively. The 1-1st to 1-3rd wiring layers 112a, 112b, and 112c may be electrically connected to a plurality of the first and/or second connection pads 120P and 220P.

A material of the insulating layers 111a and 111b is not limited to any particular material. For example, an insulating material may be used, and as an insulating material, a thermosetting resin such as an epoxy resin, a thermoplastic resin such as polyimide, a resin in which the thermosetting resin or the thermoplastic resin is mixed with an inorganic filler, an ABF, for example, may be used. A material in which the above-mentioned resin is impregnated together with an inorganic filler in a core material such as a glass fiber (or a glass cloth or a glass fabric), such as prepreg, may be used.

The first wiring layers 112a, 112b, and 112c may provide upper/lower electrical connection paths of the package along with the first wiring vias 113a and 113b, and may redistribute the first connection pad 120P and/or the second connection pad 220P. As a material of the first wiring layers 112a, 112b, and 112c, a metal material such as copper (Cu), aluminum (Al), silver (Ag), tin (Sn), gold (Au), nickel (Ni), lead (Pb), titanium (Ti), or alloys thereof may be used. The first wiring layers 112a, 112b, and 112c may perform various functions in accordance with a design of a respective layer. For example, the first wiring layers 112a, 112b, and 112c may include a ground (GND) pattern, a power (PWR) pattern, a signal (S) pattern, and the like. The signal (S) pattern may include various types of signals such as a data signal other than the ground (GND) pattern, the power (PWR) pattern, and the like. The ground (GND) pattern and the power (PWR) pattern may be the same pattern. The first wiring layers 112a, 112b, and 112c may include various types of via pads. The first wiring layers 112a, 112b, and 112c may be formed by a plating process, and may include a seed layer and a conductor layer.

A thickness of each of the first wiring layers 112a, 112b, and 112c may be greater than a thickness of each of the first redistribution layers 142. For example, the first frame 110 may have a thickness greater than a thickness of the first semiconductor chip 120, and prepreg, or the like, may be used as a material of the insulating layers 111a and 111b to maintain stiffness. Accordingly, a thickness of each of the first wiring layers 112a, 112b, and 112c may be relatively increased. A fine circuit and a high-density design may be required for the first connection member 140, and a photosensitive insulating material PID, or the like, may be used as a material of the first insulating layer 141. Accordingly, a thickness of the first redistribution layer 142 may be relatively decreased.

The 1-1st wiring layer 112a may be recessed into the 1-1st insulating layer 111a. When a stepped portion is formed between a lower surface in contact with the first connection member 140 of the 1-1st insulating layer 111a and a lower surface in contact with the first connection member 140 of the 1-1st wiring layer 112a as the 1-1st wiring layer 112a is recessed into the 1-1st insulating layer 111a, a forming material may be bled when the first semiconductor chip 120 and the interconnect member 110 are capsulated using the first encapsulant 130 such that contamination of a lower surface of the 1-1st wiring layer 112a may be prevented.

The first wiring vias 113a and 113b may electrically connect the first wiring layers 112a, 112b, and 112c disposed on different levels to one another, and may accordingly form an electrical path in the first frame 110. As a material of the first wiring vias 113a and 113b, a metal material such as copper (Cu), aluminum (Al), silver (Ag), tin (Sn), gold (Au), nickel (Ni), lead (Pb), titanium (Ti), or alloys thereof may be used. The first wiring vias 113a and 113b may include a via for a signal, a via for power, a via for ground, and the like, and a via for power and a via for ground may be the same via. The first wiring vias 113a and 113b may be a filled type via filled with a metal material, or may be a conformal type via in which a metal material is formed along a wall of a via hole. Each of the first wiring vias 113a and 113b may have a tapered shape. The first wiring vias 113a and 113b may also be formed by a plating process, and may include a seed layer and a conductor layer.

When a hole for a 1-1st wiring via 113a is formed, a partial pad of the 1-1st wiring layer 112a may work as a stopper. Thus, the 1-1st wiring via 113a may have a tapered shape in which a width of an upper surface of the 1-1st wiring via 113a may be greater than a width of a lower surface. In this case, the 1-1st wiring via 113a may be integrated with a pad pattern of the 1-2nd wiring layer 112b. When a hole for a 1-2nd wiring via 113b is formed, a partial pad of the 1-2nd wiring layer 112b may work as a stopper. Thus, the 1-2nd wiring via 113b may have a tapered shape in which a width of an upper surface of the 1-2nd wiring via 113b may be greater than a width of a lower surface. In this case, the 1-2nd wiring via 113b may be integrated with a pad pattern of the 1-3rd wiring layer 112c.

If desired, a metal layer may be disposed on an internal wall of the first through portion 110H of the first frame 110 for the purpose of shielding electromagnetic waves or heat dissipation. The metal layer may surround the first semiconductor chip 120.

The first encapsulant 130 may cover at least a portion of the first semiconductor chip 120 and the first frame 110, and may fill at least a portion of the first through portion 110H. The first encapsulant 130 may include an insulating material, and as an insulating material, a non-photosensitive insulating material, a non-photosensitive insulating material including an inorganic filler and an insulating resin, such as a thermosetting resin such as an epoxy resin, a thermoplastic resin such as polyimide, a resin formed by the above-described resin including a reinforcement such as an inorganic filler, that is, an ABF, an EMC, or the like, may be used. If desired, a material in which an insulating resin such as a thermosetting resin or a thermoplastic resin is impregnated in a core material such as an inorganic filler and/or a glass fiber may be used. Accordingly, the issues of void and undulation may be resolved, and warpage control may be easily performed. If desired, a photoimageable encapsulant (PIE) may be used.

In FIG. 10, the 1-3rd wiring layer 112c of the first frame 110 may be covered by the first encapsulant 130, and the backside via 153 may penetrate the first encapsulant 130 and may connect the 1-3rd wiring layer 112c to the backside wiring layer 152. However, an example embodiment thereof is not limited thereto, and an upper surface of the 1-3rd wiring layer 112c may be directly in contact with the backside insulating layer 151, and the backside via 153 may penetrate the backside insulating layer 151 directly in contact with the upper surface of the 1-3rd wiring layer 112c and may connect the 1-3rd wiring layer 112c to the backside wiring layer 152.

The descriptions of the other elements may be substantially the same as in the aforementioned example embodiment of the semiconductor package 500A, and thus, detailed descriptions thereof will not be provided.

Figure 11:
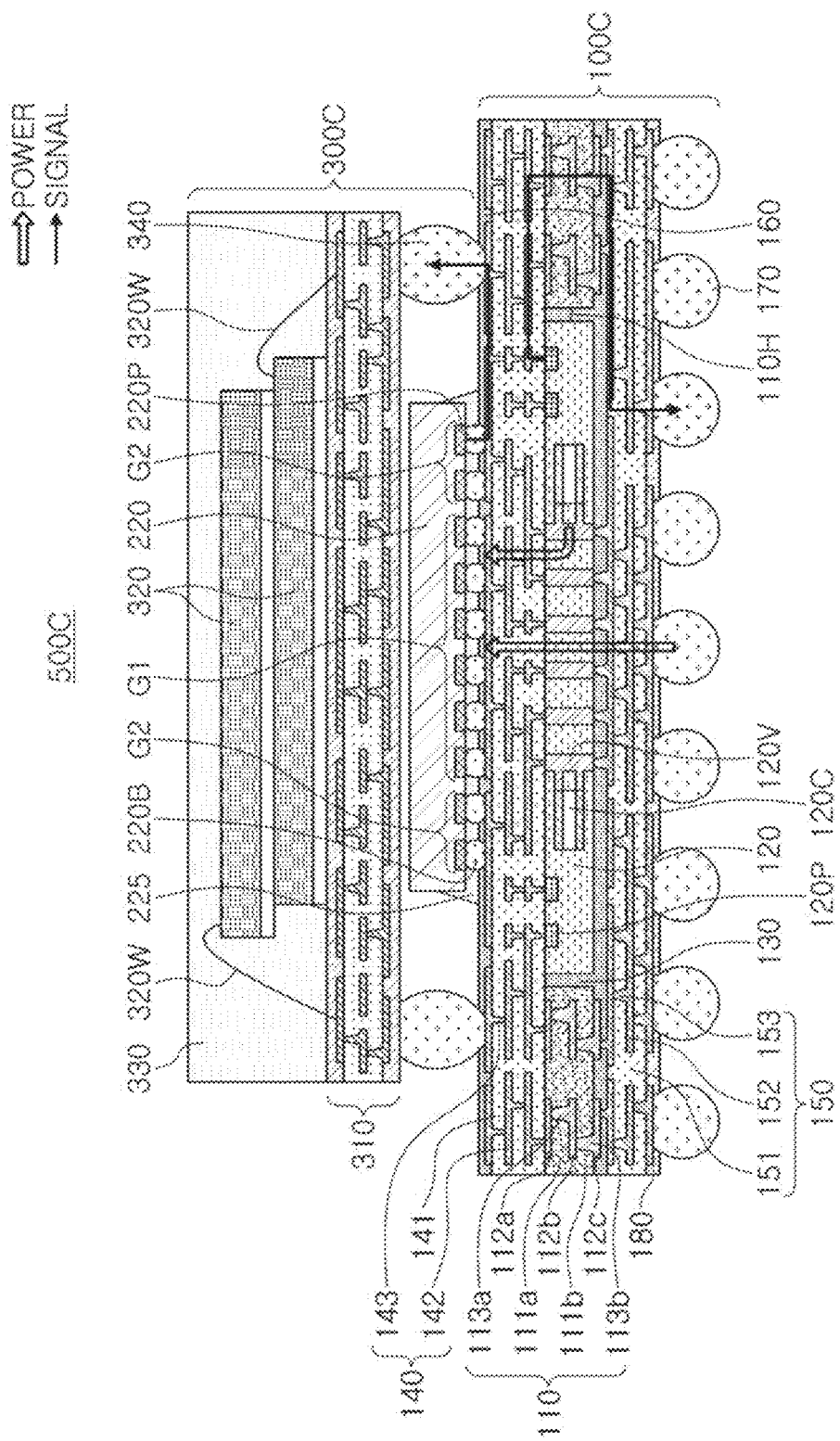
FIG. 11 is a cross-sectional diagram illustrating another example of a semiconductor package according to an example embodiment.

FIG. 11 is a cross-sectional diagram illustrating another example of a semiconductor package according to an example embodiment.

Referring to the diagram, in a semiconductor package 500C, a first package structure 100C may be disposed upside down, differently from the aforementioned first package structure 100A, to dispose a first semiconductor chip 120 to be faced-up. For example, a second semiconductor chip 220 may be mounted on a surface of a first connection member 140 of a first package structure 100C using a connection bump 220B, and the like. The second semiconductor chip 220 may be fastened to the first package structure 100C through an underfill resin 225. In this case, an electrical connection path between the first and second semiconductor chips 120 and 220 may be shortened. The second semiconductor chip 220 may be disposed on a first passivation layer 160, and a third package structures 300C may be disposed on the first passivation layer 160 with the second semiconductor chip 220 interposed therebetween. An electrical connection path of power and a signal may be as in the diagram, for example.

The descriptions of the other elements may be substantially the same as in the aforementioned example embodiment of the semiconductor package 500A, and thus, detailed descriptions thereof will not be provided.

Figure 12:
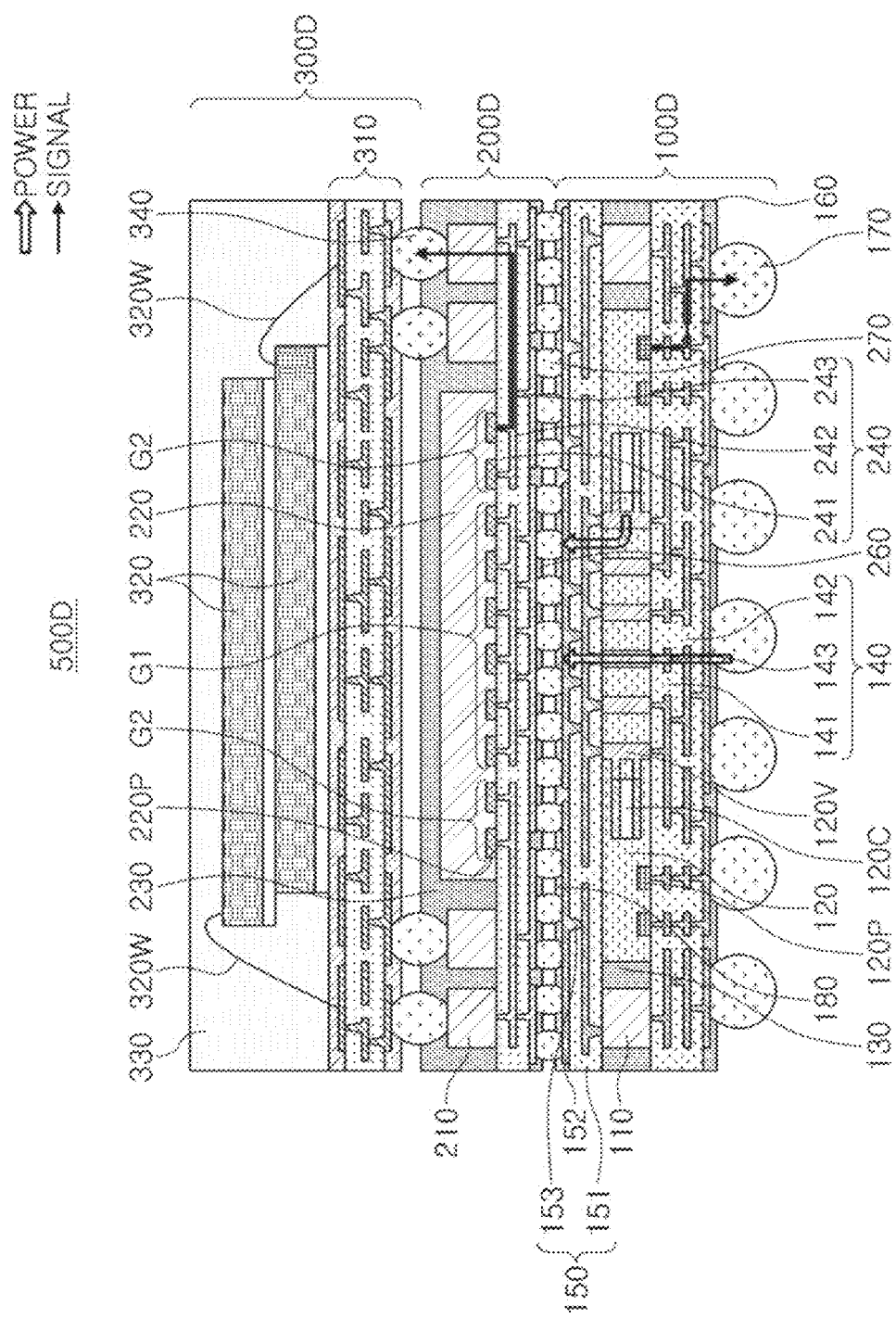
FIG. 12 is a cross-sectional diagram illustrating another example of a semiconductor package according to an example embodiment.

FIG. 12 is a cross-sectional diagram illustrating another example of a semiconductor package according to an example embodiment.

Referring to the diagram, in a semiconductor package 500D, a second package structure 200D may be disposed between first and third package structures 100D and 300D. The first and second package structures 100D and 200D may be connected to each other in a form of POP through a second electrical connector metal 270. The second and third package structures 200D and 300D may be connected to each other in a form of POP through a third electrical connector metal 340. The second package structure 200D may include a second connection member 240 disposed on a first connection member 140 or a backside connection member 150 and having a second redistribution layer 242 connected to a first redistribution layer 142 or a backside wiring layer 152, a second semiconductor chip 220 having a plurality of second connection pads 220P connected to the second redistribution layer 242, and a second encapsulant 230 disposed on the second connection member 240 and covering the second semiconductor chip 220. The second package structure 200D may further include a second interconnect member 210 disposed on the second connection member 240 and electrically connected to the second redistribution layer 242. The second interconnect member 210 may electrically connect the second redistribution layer 242 to a third electrical connector metal 340. For example, the second connection member 240 may be mounted on the backside connection member 150 through a second electrical connector metal 270.

The second encapsulant 230 may cover at least a portion of the second semiconductor chip 220 and the second interconnect member 210. The second encapsulant 230 may include an insulating material, as an insulating material, a non-photosensitive insulating material, a non-photosensitive insulating material including an inorganic filler and an insulating resin, such as a thermosetting resin such as an epoxy resin, a thermoplastic resin such as polyimide, a resin formed by the above-described resin including a reinforcement such as an inorganic filler, that is, an ABF, an EMC, or the like, may be used. If desired, a material in which an insulating resin such as a thermosetting resin or a thermoplastic resin is impregnated in a core material such as an inorganic filler and/or a glass fiber may be used. Accordingly, the issues of void and undulation may be resolved, and warpage control may be easily performed. If desired, a photoimageable encapsulant (PIE) may be used.

The second connection member 240 may redistribute the plurality of second connection pads 220P. Each of the plurality of second connection pads 220P having various functions may be redistributed through the second connection member 240, and may be physically and/or electronically connected to an external entity through the second electrical connector metal 270 in accordance with a function thereof. The second connection member 240 may include a second insulating layer 241, a second redistribution layer 242 disposed on a lower surface of the second insulating layer 241, and a second connection via 243 penetrating the second insulating layer 241 and connected to the second redistribution layer 242. The number of each of the second insulating layer 241, the second redistribution layer 242, and the second connection via 243 may be greater or lower than the examples illustrated in the diagram. In other words, in example embodiments, the number of the layers may be varied.

As a material of the second insulating layer 241, an insulating material may be used, and as an insulating material, a photosensitive insulating material (PID) may be used. In this case, a fine pitch may be introduced through a photo-via such that it may be possible to implement a fine circuit and a high-density design, and the plurality of second connection pads 220P may be redistributed in an effective manner. A boundary between the second insulating layer 241 may be distinct or indistinct.

The second redistribution layer 242 may redistribute the plurality of second connection pads 220P and may electrically connect the plurality of second connection pads 220P to the second electrical connector metal 270. As a material of the second redistribution layer 242, a metal material such as copper (Cu), aluminum (Al), silver (Ag), tin (Sn), gold (Au), nickel (Ni), lead (Pb), titanium (Ti), or alloys thereof may be used. The second redistribution layer 242 may perform various functions in example embodiments. For example, the second redistribution layer 242 may include a ground (GND) pattern, a power (PWR) pattern, a signal (S) pattern, and the like. The ground (GND) pattern and the power (PWR) pattern may be the same pattern. The second redistribution layer 242 may include various types of via pads, electrical connector metal pads, and the like. The second redistribution layer 242 may be formed by a plating process, and may include a seed layer and a conductor layer.

The second connection via 243 may electrically connect the second redistribution layers 242 disposed on different levels to one another. The second connection via 243 may also electrically connect the second connection pad 220P of the second semiconductor chip 220 and the second interconnect member 210 to the second redistribution layer 242. The second connection via 243 may be physically in contact with the second connection pad 220P when the second semiconductor chip 220 is a bare die. As a material of the second connection via 243, a metal material such as copper (Cu), aluminum (Al), silver (Ag), tin (Sn), gold (Au), nickel (Ni), lead (Pb), titanium (Ti), or alloys thereof may be used. The second connection via 243 may include a via for a signal, a via for power, a via for ground, and the like, and a via for power and a via for ground may be the same via. The second connection via 243 may also be a filled type via filled with a metal material, or may be a conformal type via in which a metal material is formed along a wall of a via hole. The second connection via 243 may have a tapered shape, tapered in a direction opposite to a tapered direction of second wiring vias 213a and 213b. The second connection via 243 may also be formed by a plating process, and may include a seed layer and a conductor layer.

A second passivation layer 260 may be an additional element for protecting the second connection member 240 from external physical and chemical damages, and others. The second passivation layer 260 may include a thermosetting resin. For example, the second passivation layer 260 may be an ABF, but an example embodiment thereof is not limited thereto. The second passivation layer 260 may have an opening for opening at least a portion of a lowermost second redistribution layer 242. Several tens to several millions of the openings may be provided, or the number of the openings may be higher or lower than the above-mentioned example. Each of the openings may include a plurality of holes. If desired, a surface mount component such as a capacitor may be disposed on a lower surface of a second passivation layer 250 and may be electrically connected to the second redistribution layer 242, and may be electrically connected to the second semiconductor chip 220 accordingly.

The second electrical connector metal 270 may physically and/or electronically connect the first and second package structures 100D and 200D to each other. The second electrical connector metal 270 may be disposed in each of the openings of the second passivation layer 250. The second electrical connector metal 270 may be formed of a low melting point metal, such as tin (Sn) or an alloy including tin (Sn), for example. As an example, the second electrical connector metal 270 may be formed of solder, or the like, but an example embodiment thereof is not limited thereto.

The second electrical connector metal 270 may be implemented as a land, a ball, a pin, or the like. The second electrical connector metal 270 may include multiple layers or a single layer. When the second electrical connector metal 270 includes multiple layers, the first electrical connector metal 170 may include a copper pillar and solder, and when the second electrical connector metal 270 includes a single layer, the second electrical connector metal 270 may include tin-silver solder or copper, but an example embodiment thereof is not limited thereto. The number of the second electrical connector metal 270, a gap between the second electrical connector metals 270, and a dispositional form of the second electrical connector metal 270 are not limited to any particular example, and may be varied in example embodiments. For example, the number of the second electrical connector metal 270 may be several tens to several millions in accordance with the number of the plurality of second connection pads 220P, and may be higher or lower than the above-mentioned example.

At least one of the second electrical connector metals 270 may be disposed in a fan-out region. A fan-out region may refer to a region beyond a region in which the second semiconductor chip 220 is disposed. A fan-out package may have improved reliability as compared to a fan-in package, may implement a plurality of I/O terminals, and may easily perform 3D interconnection. Also, a fan-out package may have a reduced thickness as compared to a ball grid array (BGA) package, a land grid array (LGA) package, and the like, and may be cost-competitive.

The second electrical connector metal 270 may be connected to a lowermost second redistribution layer 242 through an underbump metal, and in this case, connection reliability of the second electrical connector metal 270 may improve. Accordingly, board-level reliability of the second package structure 200D may improve. The underbump metal may be formed by a metallization method using a metal, but an example embodiments are not limited thereto.

The descriptions of the other elements may be substantially the same as in the aforementioned example embodiment of the semiconductor package 500A, and thus, detailed descriptions thereof will not be provided.

Figure 13:
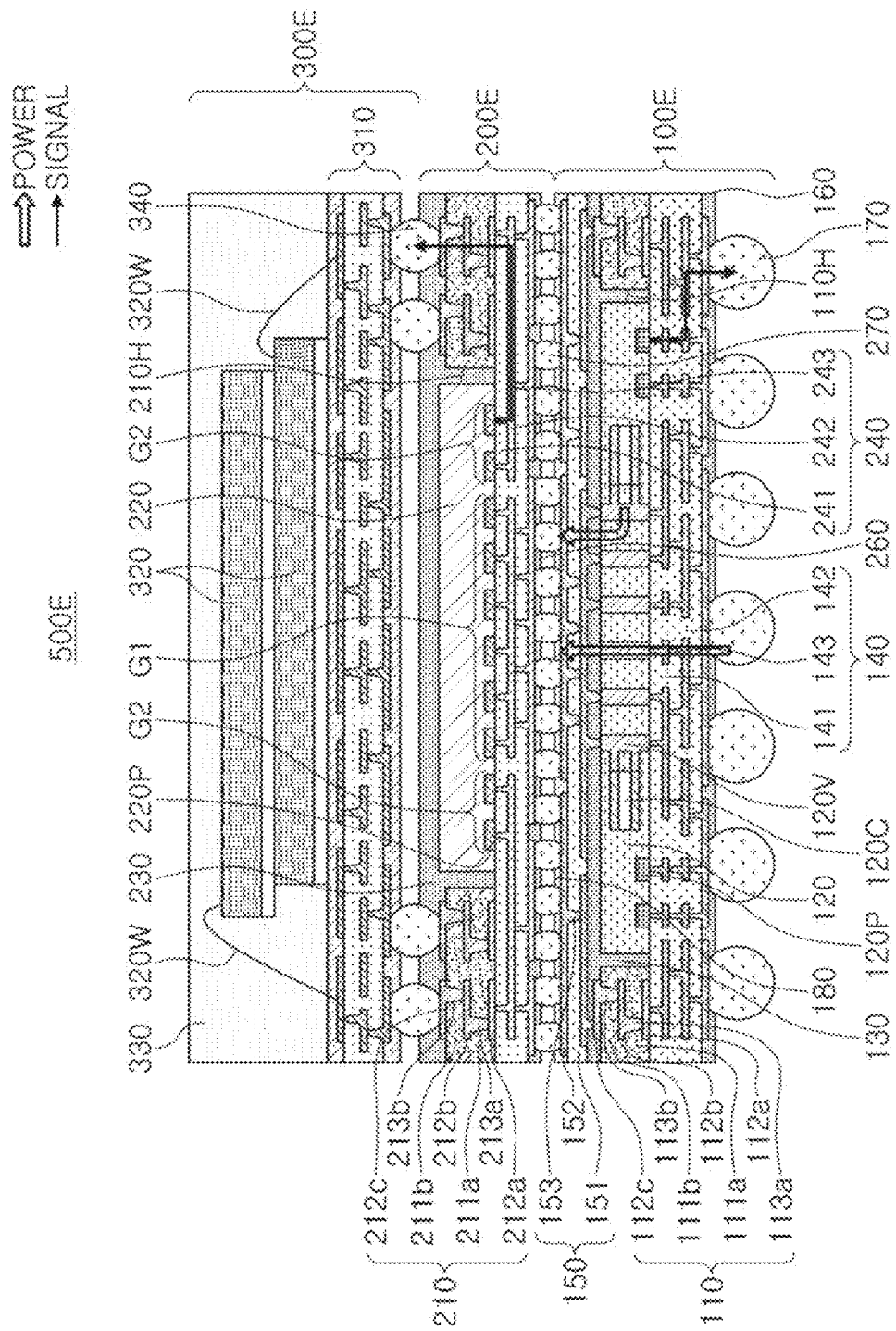
FIG. 13 is a cross-sectional diagram illustrating another example of a semiconductor package according to an example embodiment.

FIG. 13 is a cross-sectional diagram illustrating another example of a semiconductor package according to an example embodiment.

Referring to FIG. 13, in a semiconductor package 500E, a second interconnect member 210 may be configured as a second frame 210 having a second through portion 210H in which the second semiconductor chip 220 is disposed. For example, the semiconductor package 500E may include the second frame 210 having a second through portion 210H and including one or more second wiring layers 212a, 212b, and 212c, a second semiconductor chip 220 disposed in the second through portion 210H and having a plurality of second connection pads 220P, a second encapsulant 230 covering at least a portion of each of the second frame 210 and the second semiconductor chip 220 and filling at least a portion of the second through portion 210H, and a second connection member 240 disposed on a lower side of each of the second frame 210 and the second semiconductor chip 220 and including one or more second redistribution layer 242. According to an example embodiment, a second passivation layer 260 and a second electrical connector metal 270 may also be disposed on a lower side of the second connection member 240. In this case, as the second frame 210 may compensate for a height of a third electrical connector metal 340, a pitch of the third electrical connector metal 340 between the second package structure 200E and the third package structure 300E may be reduced. Accordingly, the number of inputs and outputs (I/O) of the third package structure 300C, the number of inputs and outputs (I/O) of a memory, for example, may increase. For example, an electrical connection path of power and a signal may be provided as illustrated in FIG. 13.

The second package structure 200E may include a second frame 210 having a second through portion 210H and including one or more layers of second wiring layers 212a, 212b, and 212c, the second semiconductor chip 220 disposed in the second through portion 210H and having a plurality of second connection pads 220P, the second encapsulant 230 covering at least a portion of each of the second frame 210 and the second semiconductor chip 220 and filling at least a portion of the second through portion 210H, and the second connection member 240 disposed on a lower side of each of the second frame 210 and the second semiconductor chip 220 and including one or more layers of the second redistribution layer 242. According to an example embodiment, the second passivation layer 260 and the second electrical connector metal 270 may be disposed on a lower side of the second connection member 240.

The second frame 210 may improve stiffness of the second package structure 200E depending on a specific material of second insulating layers 211a and 211b, and may secure uniformity of a thickness of the second encapsulant 230. The second frame 210 may have the second through portion 210H penetrating the second insulating layers 211a and 211b. The second semiconductor chip 220 may be disposed in the second through portion 210H, and a passive component may also be disposed in the second through portion 210H. A wall of the second through portion 210H may surround the second semiconductor chip 220, but example embodiments are not limited thereto. The second frame 210 may include the second wiring layers 212a, 212b, and 212c and second wiring vias 213a and 213b in addition to the second insulating layers 211a and 211b, and may work as an electrical connection member providing upper and lower electrical connection paths. According to an example embodiment, an electrical connection member which may provide a different form of upper and lower electrical connection paths, such as a metal post, may be included in the second frame 210.

In an example embodiment, the second frame 210 may include a 2-1st insulating layer 211a, a 2-1st wiring layer 212a in contact with the second connection member 240 and buried in the 2-1st insulating layer 211a, a 2-2nd wiring layer 212b disposed on a region opposite to the region of the 2-1st insulating layer 211a in which the 2-1st wiring layer 212a is buried, a 2-2nd insulating layer 211b disposed in a region opposite to the region of the 2-1st insulating layer 211a in which the 2-1st wiring layer 212a is buried, and covering at least a portion of the 2-2nd wiring layer 212b, and a 2-3rd wiring layer 212c disposed in a region opposite to the region of the 2-2nd insulating layer 211b in which the 2-2nd wiring layer 212b is buried. The 2-1st and 2-2nd wiring layers 212a and 212b and the 2-2nd and 2-3rd wiring layers 212b and 212c may be electrically connected to each other through the 2-1st and 2-2nd wiring vias 213a and 213b penetrating the 2-1st and 2-2nd insulating layers 211a and 211b, respectively. The 2-1st to 2-3rd wiring layers 212a, 212b, and 212c may be electrically connected to a plurality of the second connection pads 220P.

A material of the second insulating layers 211a and 211b is not limited to any particular material. For example, an insulating material may be used, and as an insulating material, a thermosetting resin such as an epoxy resin, a thermoplastic resin such as polyimide, a resin in which the thermosetting resin or the thermoplastic resin is mixed with an inorganic filler, an Ajinomoto Built-up Film (ABF), for example, may be used. Alternatively, a material in which the above-mentioned resin is impregnated together with an inorganic filler in a core material such as a glass fiber (or a glass cloth or a glass fabric), such as prepreg, may be used.

The second wiring layers 212a, 212b, and 212c may provide upper/lower electrical connection paths of the package along with the second wiring vias 213a and 213b, and may redistribute the plurality of second connection pads 220P. As a material of the second wiring layers 212a, 212b, and 212c, a metal material such as copper (Cu), aluminum (Al), silver (Ag), tin (Sn), gold (Au), nickel (Ni), lead (Pb), titanium (Ti), or alloys thereof may be used. The second wiring layers 212a, 212b, and 212c may perform various functions in accordance with a design of a respective layer. For example, the second wiring layers 212a, 212b, and 212c may include a ground (GND) pattern, a power (PWR) pattern, a signal (S) pattern, and the like. The signal (S) pattern may include various types of signals such as a data signal other than the ground (GND) pattern, the power (PWR) pattern, and the like. The ground (GND) pattern and the power (PWR) pattern may be the same pattern. The second wiring layers 212a, 212b, and 212c may include various types of via pads. The second wiring layers 212a, 212b, and 212c may be formed by a well-known plating process, and may include a seed layer and a conductor layer.

A thickness of each of the second wiring layers 212a, 212b, and 212c may be greater than a thickness of each of the second redistribution layers 242. For example, the second frame 210 may have a thickness greater than a thickness of the second semiconductor chip 220, and prepreg, or the like, may be used as a material of the second insulating layers 211a and 211b to maintain stiffness. Accordingly, a thickness of each of the second wiring layers 212a, 212b, and 212c may be relatively increased. A fine circuit and a high-density design may be required for the second connection member 240, and a photosensitive insulating material PID, or the like, may be used as a material of the second insulating layer 241. Accordingly, a thickness of the second redistribution layer 242 may be relatively decreased.

The 2-1st wiring layer 212a may be recessed into the 2-1st insulating layer 211a. When a stepped portion is formed between a lower surface in contact with the second connection member 240 of the 2-1st insulating layer 211a and a lower surface in contact with the second connection member 240 of the 2-1st wiring layer 212a as the 2-1st wiring layer 212a is recessed into the 2-1st insulating layer 211a, a forming material may be bled when the second semiconductor chip 220 and the second frame 210 are capsulated using the second encapsulant 230 such that contamination of a lower surface of the 2-1st wiring layer 212a may be prevented.

The second wiring vias 213a and 213b may electrically connect the second wiring layers 212a, 212b, and 212c disposed on different levels to one another, and may accordingly form an electrical path in the second frame 210. As a material of the second wiring vias 213a and 213b, a metal material such as copper (Cu), aluminum (Al), silver (Ag), tin (Sn), gold (Au), nickel (Ni), lead (Pb), titanium (Ti), or alloys thereof may be used. The second wiring vias 213a and 213b may include a via for a signal, a via for power, a via for ground, and the like, and a via for power and a via for ground may be the same via. The second wiring vias 213a and 213b may be a filled type via filled with a metal material, or may be a conformal type via in which a metal material is formed along a wall of a via hole. Each of the second wiring vias 213a and 213b may have a tapered shape. The second wiring vias 213a and 213b may also be formed by a plating process, and may include a seed layer and a conductor layer.

When a hole for a 2-1st wiring via 213a is formed, a partial pad of the 2-1st wiring layer 212a may work as a stopper. Thus, the 2-1st wiring via 213a may have a tapered shape in which a width of an upper surface of the 2-1st wiring via 213a may be greater than a width of a lower surface of the 2-1st wiring via 213a. In this case, the 2-1st wiring via 213a may be integrated with a pad pattern of the 2-2nd wiring layer 212b. When a hole for a 2-2nd wiring via 213b is formed, a partial pad of the 2-2nd wiring layer 212b may work as a stopper. Thus, the 2-2nd wiring via 213b may have a tapered shape in which a width of an upper surface of 2-2nd wiring via 213b may be greater than a width of a lower surface of 2-2nd wiring via 213b. In this case, the 2-2nd wiring via 213b may be integrated with a pad pattern of the 2-3 wiring layer 212c.

According to an example embodiment, a metal layer may be disposed on an internal wall of the second through portion 210H of the second frame 210 to shield electromagnetic waves or heat dissipation. The metal layer may surround the second semiconductor chip 220.

The second encapsulant 230 may cover at least a portion of the second semiconductor chip 220 and the second frame 210, and may fill at least a portion of the second through portion 210H. The second encapsulant 230 may include an insulating material, and as an insulating material, a non-photosensitive insulating material, a non-photosensitive insulating material including an inorganic filler and an insulating resin, such as a thermosetting resin such as an epoxy resin, a thermoplastic resin such as polyimide, a resin formed by the above-described resin including a reinforcement such as an inorganic filler, that is, an ABF, an EMC, or the like, may be used. If desired, a material in which an insulating resin such as a thermosetting resin or a thermoplastic resin is impregnated in a core material such as an inorganic filler and/or a glass fiber may be used. Accordingly, the issues of void and undulation may be prevented or reduced, and warpage control may be more easily performed. If desired, a photoimageable encapsulant (PIE) may be used.

Figure 14:
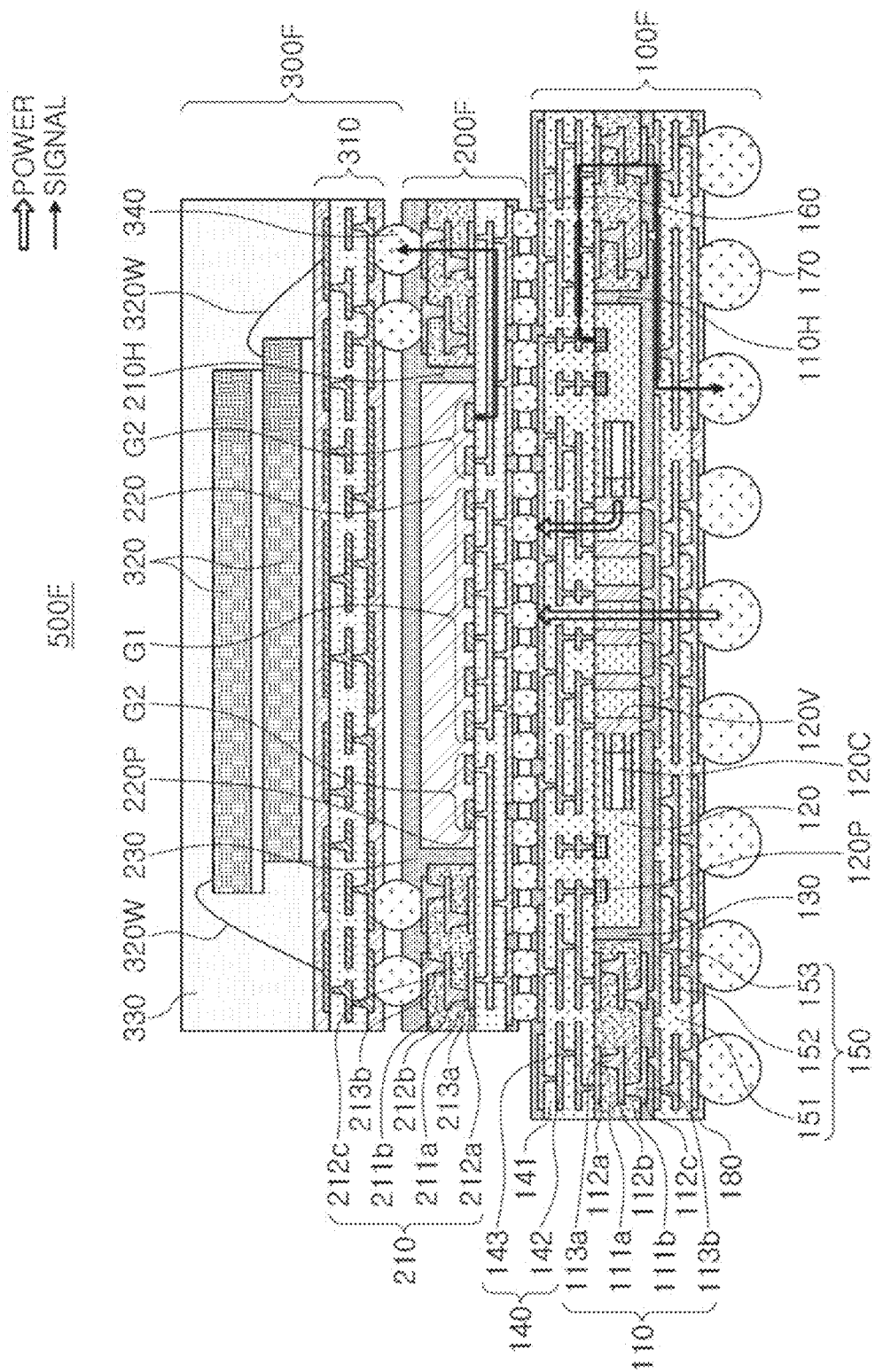
FIG. 14 is a cross-sectional diagram illustrating another example of a semiconductor package according to an example embodiment.

FIG. 14 is a cross-sectional diagram illustrating another example of a semiconductor package according to an example embodiment.

Referring to FIG. 14, in a semiconductor package 500F, a first package structure 100F may be disposed upside down, different from the aforementioned first package structure 100A, to dispose a first semiconductor chip 120 to be faced-up. For example, a second semiconductor chip 220 may be mounted on a surface of a first connection member 140 of a first package structure 100F using a connection bump 220B, and the like. The second semiconductor chip 220 may be fastened to the first package structure 100F through an underfill resin 225. Also, a second package structure 200F may be disposed between first package structure 100F and the third package structure 300F. The first package structure 100F and the second package structure 200F may be connected to each other in a form of POP through the second electrical connector metal 270. Second package structure 200F and the third package structure 300F may be connected to each other in a form of POP through an third electrical connector metal 340. For example, an electrical connection path of power and a signal may be as provided as illustrated in FIG. 14.

The second package structure 200F may include a second frame 210 having a second through portion 210H and including one or more second wiring layers 212a, 212b, and 212c, the second semiconductor chip 220 disposed in the second through portion 210H and having a plurality of second connection pads 220P, the second encapsulant 230 covering at least a portion of each of the second frame 210 and the second semiconductor chip 220 and filling at least a portion of the second through portion 210H, and the second connection member 240 disposed on a lower side of each of the second frame 210 and the second semiconductor chip 220 and including one or more second redistribution layers 242. According to an example embodiment, the second passivation layer 260 and the second electrical connector metal 270 may be disposed on a lower side of the second connection member 240.

The descriptions of the other elements may be substantially the same as in the aforementioned example embodiments of the semiconductor package 500A and the semiconductor packages 500B and 500C, and thus, detailed descriptions thereof will not be provided.

According to the aforementioned example embodiments, a semiconductor package having improved package performance and having an appropriate package size may be provided.

In the example embodiments, a lower side, a lower portion, a lower surface, and the like, may refer to a downward direction with reference to a cross-sectional surface in the diagram, and an upper side, an upper portion, an upper surface, and the like, may refer to an opposite direction. The directions, however, may be defined for ease of descriptions, and a scope of right of claims are not limited thereto, and may be varied.

In the example embodiments, when an element is mentioned as being "connected" to another component, this may mean that the element is directly connected to another component, and may also mean that the element is indirectly connected to another component with an intervening element therebetween. Also, when an element is mentioned as being "electrically connected" may indicate that the element may be physically connected or may not be physically connected.

While terms such as "first" and "second," etc., may be used to describe various components, such components must not be understood as being limited to the above terms. The above terms are used only to distinguish one component from another. For example, a first component may be referred to as a second component without departing from the scope of rights of the present invention, and likewise a second component may be referred to as a first component.

In the example embodiments, "one example embodiment" may not refer to the same example embodiment, and may be provided to emphasize different unique features. The aforementioned example embodiments do not exclude combination or addition of one or more features of another example embodiment. For example, even though matters described in one example embodiment are not described in another example embodiment, the matters may be understood as being related to another example embodiment unless otherwise indicated.

The terms used in the following description are provided to explain a specific exemplary embodiment and are not intended to be limiting. A singular term includes a plural form unless otherwise indicated.

While the example embodiments have been shown and described above, it will be apparent to those skilled in the art that modifications and variations could be made without departing from the scope as defined by the appended claims.

What is claimed is:

1. A semiconductor package comprising:
a package structure comprising a base connection member comprising a redistribution layer, a first semiconductor chip comprising a plurality of first connection pads connected to the redistribution layer, an encapsulant disposed on the base connection member and covering at least a portion of the first semiconductor chip, a backside connection member disposed on the encapsulant and comprising a backside wiring layer electrically connected to the redistribution layer, a through-via penetrating through the first semiconductor chip, and an electronic component disposed inside of the first semiconductor chip and electrically connected to the through-via; and
a second semiconductor chip disposed on the base connection member or the backside connection member, the second semiconductor chip comprising a plurality of second connection pads connected to the redistribution layer or the backside wiring layer,
wherein the second semiconductor chip comprises a logic circuit, the first semiconductor chip comprises a logic input terminal and a logic output terminal that are respectively connected to the logic circuit through at least one of the redistribution layer and the backside wiring layer.

2. The semiconductor package of claim 1, wherein the package structure further comprises an interconnect member disposed between the base connection member and the backside connection member and electronically connecting the redistribution layer and the backside wiring layer.

3. The semiconductor package of claim 1, wherein the plurality of second connection pads comprise at least a first group of second connection pads and a second group of second connection pads, and second connection pads included in the first group are connected to the logic circuit, and
wherein the plurality of first connection pads comprise an input pad connected to the logic input terminal and an output pad connected to the logic output terminal.

4. The semiconductor package of claim 1, wherein the logic circuit comprises a central processing unit, a graphics processing unit, a neural processing unit, a digital signal processor unit, and an image signal processing unit.

5. The semiconductor package of claim 1, wherein the through-via connects the redistribution layer to the backside wiring layer.

6. The semiconductor package of claim 5, wherein the second semiconductor chip overlaps the first semiconductor chip in a direction in which the second semiconductor chip is disposed on the first semiconductor chip, and
wherein at least a portion of the plurality of second connection pads are electrically connected to one of the backside wiring layer and the redistribution layer through the through-via.

7. The semiconductor package of claim 1, further comprising:
a third package structure comprising a third connection member disposed on an upper side of the second semiconductor chip, a third semiconductor chip disposed on the third connection member, a molding material disposed on the third connection member and covering at least a portion of the third semiconductor chip, and a third electrical connector metal connecting the third connection member to one of the base connection member and the backside connection member.

8. The semiconductor package of claim 7, wherein the third semiconductor chip comprises a memory,
wherein the second semiconductor chip further includes a memory input terminal and a memory output terminal for the memory,
wherein the plurality of second connection pads comprise at least a first group of the second connection pads and a second group of the second connection pads, the second connection pads included in the first group is connected to the logic circuit, and the second connection pads included the second group is connected to the memory input terminal and the memory output terminal, and wherein the plurality of first connection pads comprise an input pad and an output pad respectively connected to the logic input terminal and the logic output terminal.

9. The semiconductor package of claim 1, further comprising:
a plurality of connection bumps disposed between the package structure and the second semiconductor chip and connecting the plurality of second connection pads to at least one of the redistribution layer and the backside wiring layer.

10. A semiconductor package comprising:
a first package structure comprising a first connection member comprising a first redistribution layer, a first semiconductor chip comprising a plurality of first connection pads connected to the first redistribution layer, a first encapsulant disposed on the first connection member and covering at least a portion of the first semiconductor chip, a backside connection member disposed on the first encapsulant and comprising a backside wiring layer electrically connected to the first redistribution layer;
a second package structure comprising a second connection member disposed on the first connection member or the backside connection member and comprising a second redistribution layer connected to the first redistribution layer or the backside wiring layer, a second semiconductor chip comprising a plurality of second connection pads connected to the second redistribution layer, and a second encapsulant disposed on the second connection member and covering at least a portion of the second semiconductor chip; and
a third package structure comprising a third connection member disposed on an upper side of the second package structure, a third semiconductor chip disposed on the third connection member, a molding material disposed on the third connection member and covering at least a portion of the third semiconductor chip, and a third electrical connector metal electrically connecting the third connection member to the second redistribution layer,
wherein the second semiconductor chip comprises a logic circuit, the first semiconductor chip comprises a logic input terminal and a logic output terminal for the logic circuit that are connected to the logic circuit through at least one of the first redistribution layer, the backside wiring layer, and the second redistribution layer.

11. The semiconductor package of claim 10, wherein the first package structure comprises a first interconnect member disposed between the first connection member and the backside connection member, the first interconnect member electrically connecting the first redistribution layer to the backside wiring layer, and
wherein the second package structure comprises a second interconnect member disposed on the second connection member and electrically connected to the second redistribution layer.

12. The semiconductor package of claim 10, wherein the first semiconductor chip further comprises a through-via, and
wherein the through-via connects the first redistribution layer to the backside wiring layer.

13. The semiconductor package of claim 12, wherein the second semiconductor chip overlaps the first semiconductor chip in a direction in which the second semiconductor chip is disposed on the first semiconductor chip, and wherein at least a portion of the plurality of second connection pads is electrically connected to one of the backside wiring layer and the first redistribution layer through the through-via.

14. The semiconductor package of claim 12, further comprising:
an electronic component disposed in the first semiconductor chip and electrically connected to the through-via.

15. The semiconductor package of claim 10, further comprising:
a second electrical connector metal disposed between the first package structure and the second package structure and connecting the second redistribution layer to one of the first redistribution layer and the backside wiring layer.

16. The semiconductor package of claim 10, wherein the first package structure further comprises a cover layer disposed on the backside connection member.

17. The semiconductor package of claim 10, wherein the first package structure further comprises a passivation layer disposed on the first connection member, and a first electrical connector metal penetrating the passivation layer and connected to the first redistribution layer.

18. A semiconductor package comprising:
a first package structure comprising a first connection member comprising a first redistribution layer, a first semiconductor chip comprising a plurality of first connection pads connected to the first redistribution layer, a first encapsulant disposed on the first connection member and covering at least a portion of the first semiconductor chip, a backside connection member disposed on the first encapsulant and comprising a backside wiring layer electrically connected to the first redistribution layer, and an interconnect member disposed between the first connection member and the backside connection member and electrically connecting the first redistribution layer to the backside wiring layer;
a second semiconductor chip disposed on the first connection member or the backside connection member, and comprising a plurality of second connection pads connected to the first redistribution layer or the backside wiring layer; and
a third package structure comprising a third connection member disposed on the first package structure and the second semiconductor chip, a third semiconductor chip disposed on the third connection member, and a molding material disposed on the third connection member and covering at least a portion of the third semiconductor chip, and a third electrical connector metal electrically connecting the third connection member to one of the first connection member and the backside connection member,
wherein the third semiconductor chip comprises a memory,
wherein the second semiconductor chip comprises a logic circuit and a memory input terminal and a memory output terminal for the memory,
wherein the first semiconductor chip comprises a logic input terminal and a logic output terminal for the logic circuit,
wherein the logic input terminal and the logic output terminal connected to the logic circuit through at least one of the first redistribution layer and the backside wiring layer, and wherein the memory input terminal and the memory output terminal are connected to the memory through at least one of the first redistribution layer and the backside wiring layer.

\* \* \* \* \*